(12) United States Patent
Shibata et al.

(10) Patent No.: US 8,542,179 B2
(45) Date of Patent: Sep. 24, 2013

(54) GATE SIGNAL LINE DRIVING CIRCUIT AND DISPLAY DEVICE WITH SUPPRESSION OF CHANGES IN THE THRESHOLD VOLTAGE OF THE SWITCHING ELEMENTS

(75) Inventors: Takeshi Shibata, Mobara (JP); Yoshihiro Kotani, Chiba (JP); Takahiro Ochiai, Chiba (JP); Mitsuru Goto, Chiba (JP)

(73) Assignees: Hitachi Displays, Ltd., Chiba (JP); Panasonic Liquid Crystal Display Co., Ltd., Hyogo-Ken (JP)

( * ) Notice: Subject to any disclaimer, the term of this patent is extended or adjusted under 35 U.S.C. 154(b) by 174 days.

(21) Appl. No.: 12/977,941

(22) Filed: Dec. 23, 2010

(65) Prior Publication Data

US 2011/0157112 A1 Jun. 30, 2011

(30) Foreign Application Priority Data

Dec. 25, 2009 (JP) .................................. 2009-295516

(51) Int. Cl.
*G09G 3/36* (2006.01)
(52) U.S. Cl.
USPC .......................................... 345/100; 345/205
(58) Field of Classification Search
USPC ................................................ 345/100, 205
See application file for complete search history.

(56) References Cited

U.S. PATENT DOCUMENTS

| | | | |
|---|---|---|---|
| 7,203,264 B2 * | 4/2007 | Lo et al. .......................... | 377/64 |
| 2005/0008114 A1 * | 1/2005 | Moon .............................. | 377/64 |
| 2007/0040793 A1 * | 2/2007 | Kim et al. ...................... | 345/100 |
| 2007/0070020 A1 | 3/2007 | Edo et al. | |

FOREIGN PATENT DOCUMENTS

JP 2007-95190 4/2007

* cited by examiner

*Primary Examiner* — Kwang-Su Yang
(74) *Attorney, Agent, or Firm* — Antonelli, Terry, Stout & Kraus, LLP.

(57) ABSTRACT

A gate signal line driving circuit and a display device includes first and second low voltage application switching elements that supply a low voltage to gate signal lines, a holding capacitor that is connected to a reset target node and supplies an ON signal towards the first and second low voltage application switching elements in a signal low period, first and third control switching elements the one ends of which are connected to the switch input of the first or second low voltage application switching element, and second and fourth control switching elements which each are provided between the switch input of the first or second low voltage application switching element and one end of the holding capacitor. In a startup period, a high voltage is supplied to the holding capacitor through the first to fourth control switching elements.

13 Claims, 14 Drawing Sheets

GATE SIGNAL LINE DRIVING CIRCUIT AND DISPLAY DEVICE WITH SUPPRESSION OF CHANGES IN THE THRESHOLD VOLTAGE OF THE SWITCHING ELEMENTS

CROSS-REFERENCE TO RELATED APPLICATION

The present application claims priority from Japanese application JP2009-295516 filed on Dec. 25, 2009, the content of which is hereby incorporated by reference into this application.

BACKGROUND OF THE INVENTION

1. Field of the Invention

The present invention relates to a gate signal line driving circuit and a display device using the same. More particularly, the invention relates to suppression of changes in the threshold voltage of the switching elements of a gate signal line driving circuit and improvement in the display performance of a display device using the switching elements.

2. Description of the Related Art

In display devices such as liquid crystal display devices, there are cases where a display device with an internal shift register has been adopted. The display device with an internal shift register has a configuration in which shift register circuits provided in a gate signal line driving circuit that scans gate signal lines are formed on the same substrate as a thin film transistor (hereinafter referred to as a TFT) disposed on a pixel region of a display screen. A shift register circuit according to the related art is disclosed in JP 2007-95190 A.

Each of a plurality of fundamental circuits that constitute the shift register circuits provided in a gate signal line driving circuit output a high voltage to a gate signal line as a gate signal $G_{out}$ in a gate scanning period (hereinafter referred to as a signal high period) during one frame period, corresponding to a gate signal line to which a gate signal is output from the fundamental circuit, and outputs a low voltage to the gate signal line as a gate signal $G_{out}$ in a period other than the gate scanning period (hereinafter referred to as a signal low period).

FIG. 14 is a schematic diagram showing a simplified configuration of a fundamental circuit of a shift register circuit according to the related art. The fundamental circuit of the shift register circuit includes a low voltage application switching element SWA that outputs a low voltage to a gate signal line in response to a signal low period and a high voltage application switching element SWG that outputs a high voltage to a gate signal line in response to a signal high period.

A low voltage line $V_{GL}$ is connected to the input side of the low voltage application switching element SWA. The low voltage application switching element SWA is turned ON and a low voltage which is the voltage of the low voltage line $V_{GL}$ is output as the gate signal $G_{out}$ in response to the start of the signal low period so that a low voltage is output stably as the gate signal $G_{out}$ during the signal low period. Moreover, the low voltage application switching element SWA is turned OFF in response to the start of the signal high period. A node at which a voltage is applied to the switch of the low voltage application switching element SWA will be denoted as a node N2. During a period when the low voltage application switching element SWA is in the ON state, the node N2 is changed so as to have a high voltage, and a high voltage is applied to the switch of the low voltage application switching element SWA. Furthermore, during a period when the low voltage application switching element SWA is in the OFF state, the node N2 is changed so as to have a low voltage, and a low voltage is applied to the switch of the low voltage application switching element SWA.

A fundamental clock signal CLK is input to the input side of the high voltage application switching element SWG. The high voltage application switching element SWG is turned ON and the voltage of the fundamental clock signal CLK is output as the gate signal $G_{out}$ in response to the signal high period so that a high voltage is output to the corresponding gate signal line in the signal high period.

Here, the fundamental clock signal CLK is at a high voltage during the signal high period. Moreover, the high voltage application switching element SWG is turned OFF in response to the signal low period, and the signal of the fundamental clock signal CLK is cut and is not output. A node at which a voltage is applied to the switch of the high voltage application switching element SWG is denoted as a node N1. During a period when the high voltage application switching element SWG is in the ON state, the node N1 is at a high voltage, and a high voltage is applied to the switch of the high voltage application switching element SWG. Furthermore, during a period when the high voltage application switching element SWG is in the OFF state, the node N1 is at a low voltage, and a low voltage is applied to the switch of the high voltage application switching element SWG.

A switching signal supply switching element SWB that supplies a low voltage in response to the signal low period is connected to the switch of the high voltage application switching element SWG. The low voltage line $V_{GL}$ is connected to the input side of the switching signal supply switching element SWB, and thus, in response to the signal low period, the switching signal supply switching element SWB is turned ON, the node N1 is changed so as to have a low voltage, and a low voltage is applied to the switch of the high voltage application switching element SWG. Moreover, the switching signal supply switching element SWB is turned OFF in response to the signal high period. The voltage of the node N2 is supplied to the switch of the switching signal supply switching element SWB similarly to the switch of the low voltage application switching element SWA. As described above, during a period when the switching signal supply switching element SWB is in the ON state, the node N2 is at a high voltage and a high voltage is applied to the switch of the switching signal supply switching element SWB.

FIG. 15 is a circuit diagram showing an example of the fundamental circuit of the shift register circuit according to the related art. In FIG. 15, a transistor T6 provided in a low voltage application switching circuit 211 corresponds to the low voltage application switching element SWA. Similarly, a transistor T5 provided in a high voltage application switching circuit 212 corresponds to the high voltage application switching element SWG. In addition, a transistor T2 provided in a switching signal supply switching circuit 213 corresponds to the switching signal supply switching element SWB.

A step-up capacitor C1 provided between the gate and source electrodes of the transistor T5 has a function of applying a bootstrap voltage to the gate electrode when a high voltage is applied to a gate signal $G_n$ and suppressing deformation of a waveform.

During the signal low period, a high voltage is periodically supplied from the transistor T3, and the high voltage is held in a holding capacitor C3, whereby the node N2 is maintained at the high voltage. The transistor T6 is turned ON by the high voltage of the node N2, and the low voltage of the low voltage line $V_{GL}$ is output through an output terminal OUT as the gate signal $G_n$. Moreover, the transistor T2 is also turned ON, and the node N1 is held at the low voltage of the low voltage line $V_{GL}$.

On the other hand, the transistor T1 is turned ON in response to the signal high period by a gate signal $G_{n-1}$ of a fundamental circuit on the previous stage, which is input to an input terminal IN3, and the node N1 is changed so as to have a high voltage. Accordingly, the voltage of a fundamental clock signal $V_n$ input through an input terminal IN1 is output through the output terminal OUT as the gate signal $G_n$. Moreover, the transistor T7 is turned ON by the gate signal $G_{n-1}$, whereby the node N2 is changed so as to have a low voltage. After that, when the node N1 is changed so as to have a high voltage, the transistor T4 is turned ON, whereby the node N2 is maintained at the low voltage of the low voltage line $V_{GL}$. After that, when another signal low period comes again, a transistor T9 is turned ON by a gate signal $G_{n+2}$ supplied through the input terminal IN4, and the node N1 is changed so as to have a low voltage. The above-described operation is repeated.

That is, the nodes N1 and N2 are maintained at the low and high voltages, respectively, in response to the signal low period and are changed so as to have the high and low voltages, respectively, in response to the signal high period.

Moreover, the potentials of the nodes N1 and N2 are unstable at the startup of the display device. A startup reset transistor T10 is provided between the node N2 and a high voltage line $V_{GH}$, so that when the transistor T10 is turned ON by an auxiliary signal $V_{ST}$ at the time of startup, the node N2 is changed so as to have a high voltage, and the circuit is initialized. In this configuration, when the node N2 is changed so as to have the high voltage, the node N1 is also initialized with the low voltage.

A phenomenon called Vth shift where a threshold voltage $V_{th}$ of a transistor changes in accordance with the relationship of voltages applied to the respective electrodes of the transistor exists. The Vth shift occurs under conditions where the proportion of a period where a high voltage is applied to the gate electrode and a low voltage is applied to at least one of the source and drain electrodes is large. The Vth shift occurs also under conditions where the proportion of a period where a low voltage is applied to the gate electrode and a high voltage is applied to at least one of the source and drain electrodes is large.

In the startup reset transistor, an OFF voltage (a low voltage in the example of FIG. 15) is applied to the gate electrode thereof during a period other than the startup, namely the majority period, and an ON voltage (a high voltage in the example of FIG. 15) is applied to the drain electrode thereof. Thus, the Vth shift occurs, and the threshold voltage Vth of the transistor is shifted. In the example of FIG. 15, the threshold voltage Vth is shifted to a negative direction. Thus, off-leakage, malfunctioning, and the like are likely to occur, which may cause deterioration of a display performance.

Moreover, for example, when the Vth shift occurs in the low voltage application switching element SWA and the like and the threshold voltage $V_{th}$ thereof exceeds a critical value, the low voltage application switching element SWA is not sufficiently turned ON in response to the signal low period. Thereupon, a sufficiently low voltage is not output to the gate signal, and noise is superimposed on the gate signal. Moreover, when the threshold voltage $V_{th}$ of the switching signal supply switching element SWB exceeds a critical value, the switching signal supply switching element SWB is not sufficiently turned ON in response to the signal low period, and a sufficiently low voltage cannot be applied to the node N1.

Thus, the transistor T5 is not sufficiently turned OFF, and a part of the fundamental clock signal CLK is applied to the gate signal as noise.

When noise is superimposed on the gate signal, even during the signal low period, a display data voltage which should be written to other pixels is written to pixels connected to the gate signal line, and a display performance deteriorates.

SUMMARY OF THE INVENTION

The invention has been made in view of the problems, and aims to provide a gate signal line driving circuit capable of suppressing deterioration of performance caused by the Vth shift in the startup reset transistor and other transistors that constitute a shift register circuit and a display device using the same.

An outline of representative inventions of the inventions disclosed in the specification of this application will be briefly described below.

(1) A gate signal line driving circuit which applies a high voltage to gate signal lines in a signal high period and applies a low voltage to the gate signal lines in a signal low period different from the signal high period, including: a high voltage application switching element which is put into an ON state in response to the signal high period to apply a high voltage to the gate signal lines and which is put into an OFF state in response to the signal low period; first and second low voltage application switching elements which are connected in parallel to the gate signal lines and which apply a low voltage to the gate signal lines when they are in the ON state; a control voltage output circuit which includes a holding capacitor that supplies an ON signal toward at least one of the switch inputs of the first and second low voltage application switching elements in the signal low period; a first control switching element which is put into an ON state in a first period including the high and low periods and which puts the first low voltage application switching element into an OFF state; a second control switching element which is put into an ON state in a second period that is different from the first period and includes the high and low periods and which transmits the ON signal to the first low voltage application switching element; a third control switching element which is put into an ON state in the second period and which puts the second low voltage application switching element into an OFF state; a fourth control switching element which is put into an ON state in the first period and which transmits the ON signal to the second low voltage application switching element; and a shift register control circuit which controls ON/OFF of the first to fourth control switching elements, wherein the shift register control circuit puts the first to fourth control switching elements into an ON state in a startup period before the first and second periods and supplies an initial voltage that cause electric charge to be stored in the holding capacitor, the electric charge supplying the ON signal to the holding capacitor through the first and third control switching elements, and wherein the shift register control circuit puts the first and fourth control switching elements into an ON state and the second and third control switching elements into an OFF state in the first period and puts the second and third control switching elements into an ON state and the first and fourth control switching elements into an OFF state in the second period.

(2) In the gate signal line driving circuit according to (1), the shift register control circuit may include a first conversion switch one end of which is connected to the switch inputs of the first and fourth control switching elements and which supplies a control switch-on signal to the switch inputs in the startup period and the first period, and a second conversion switch one end of which is connected to the switch inputs of the second and third control switching elements and which supplies a control switch-on signal to the switch inputs in the startup period and the second period.

(3) In the gate signal line driving circuit according to (2), one end of the holding capacitor may be connected to one end of the second control switching element and one end of the fourth control switching element, the first control switching element may be provided between the other end of the second control switching element and the second conversion switch included in the shift register control circuit, the third control switching element may be provided between the other end of the fourth control switching element and the first conversion switch included in the shift register control circuit, the first conversion switch included in the shift register control circuit may supply a high voltage towards the third control switching element in the startup period and the first period and supply a low voltage towards the third control switching element in the second period, and the second conversion switch included in the shift register control circuit may supply a high voltage towards the first control switching element in the startup period and the second period and supply a low voltage towards the first control switching element in the first period.

(4) In the gate signal line driving circuit according to any one of (1) to (3), the gate signal line driving circuit may further include first and second switching signal supply switching elements which are connected in parallel to the switch input of the high voltage application switching element and which apply a low voltage to the switch input of the high voltage application switching element when they are in the ON state, the holding capacitor may supply an ON signal towards at least one of the switch inputs of the first and second low voltage application switching elements and at least one of the switch inputs of the first and second switching signal supply switching elements in the signal low period, the second control switching element may be put into an ON state in the first period to supply the ON signal to the first low voltage application switching element and the first switching signal supply switching element, and the fourth control switching element may be put into an ON state in the second period to supply the ON signal to the second low voltage application switching element and the second switching signal supply switching element.

(5) In the gate signal line driving circuit according to any one of (1) to (3), the shift register control circuit may supply a low voltage to the gate signal lines through the first and second low voltage application switching elements in the startup period.

(6) In the gate signal line driving circuit according to (4), the shift register control circuit may supply a low voltage to the gate signal lines through the first and second low voltage application switching elements in the startup period and supply a low voltage to the high voltage application switching element through the first and second switching signal supply switching elements.

(7) In the gate signal line driving circuit according to any one of (1) to (6), the control voltage output circuit may further include a charge supply switching element one end of which is connected to one end of the holding capacitor and which periodically supplies a voltage that causes electric charge to be stored in the holding capacitor in the first and second periods, the electric charge supplying an ON signal to the holding capacitor, and the charge supply switching element may be put into an OFF state in the startup period and the other end of which is supplied with a high voltage.

(8) In the gate signal line driving circuit according to (2), the shift register control circuit may further include a low voltage conversion switch which supplies a low voltage to the control voltage output circuit in the startup period and the first and second periods, and the first and second conversion switches and the low voltage conversion switch included in the shift register control circuit may supply a high voltage when a power supply voltage decreases.

(9) A display device including the gate signal line driving circuit according to any one of (1) to (8).

According to the invention, a gate signal line driving circuit capable of suppressing deterioration of display performance caused by the Vth shift in the startup reset transistor and other transistors that constitute a shift register circuit and a display device using the same are provided.

DETAILED DESCRIPTION OF THE INVENTION

Figure 1:
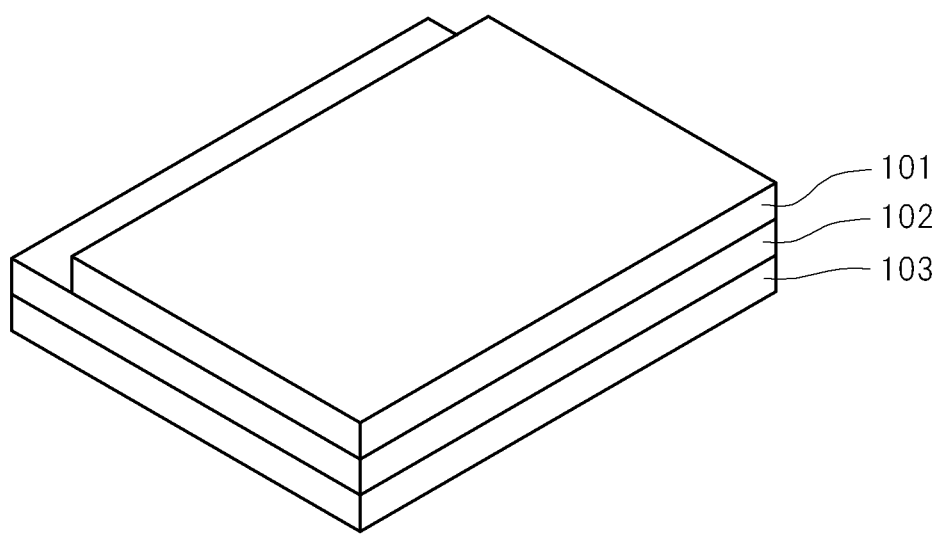
FIG. 1 is a general perspective view of a liquid crystal display device according to an embodiment of the invention.

A display device according to an embodiment of the invention is an IPS (In-Plane Switching)-mode liquid crystal display device. FIG. 1 is a general perspective view of a liquid crystal display device according to the embodiment of the invention. The liquid crystal display device shown in FIG. 1 includes a TFT substrate 102, on which gate signal lines 105, video signal lines 107, pixel electrodes 110, common electrodes 111, TFTs 109, and the like, described later, are disposed; a filter substrate 101 which faces the TFT substrate 102 and in which color filters are provided; a liquid crystal material sealed in a region which is interposed by the two substrates; and a backlight 103 which is positioned in contact with a side of the TFT substrate 102 opposite the filter substrate 101.

Figure 2:
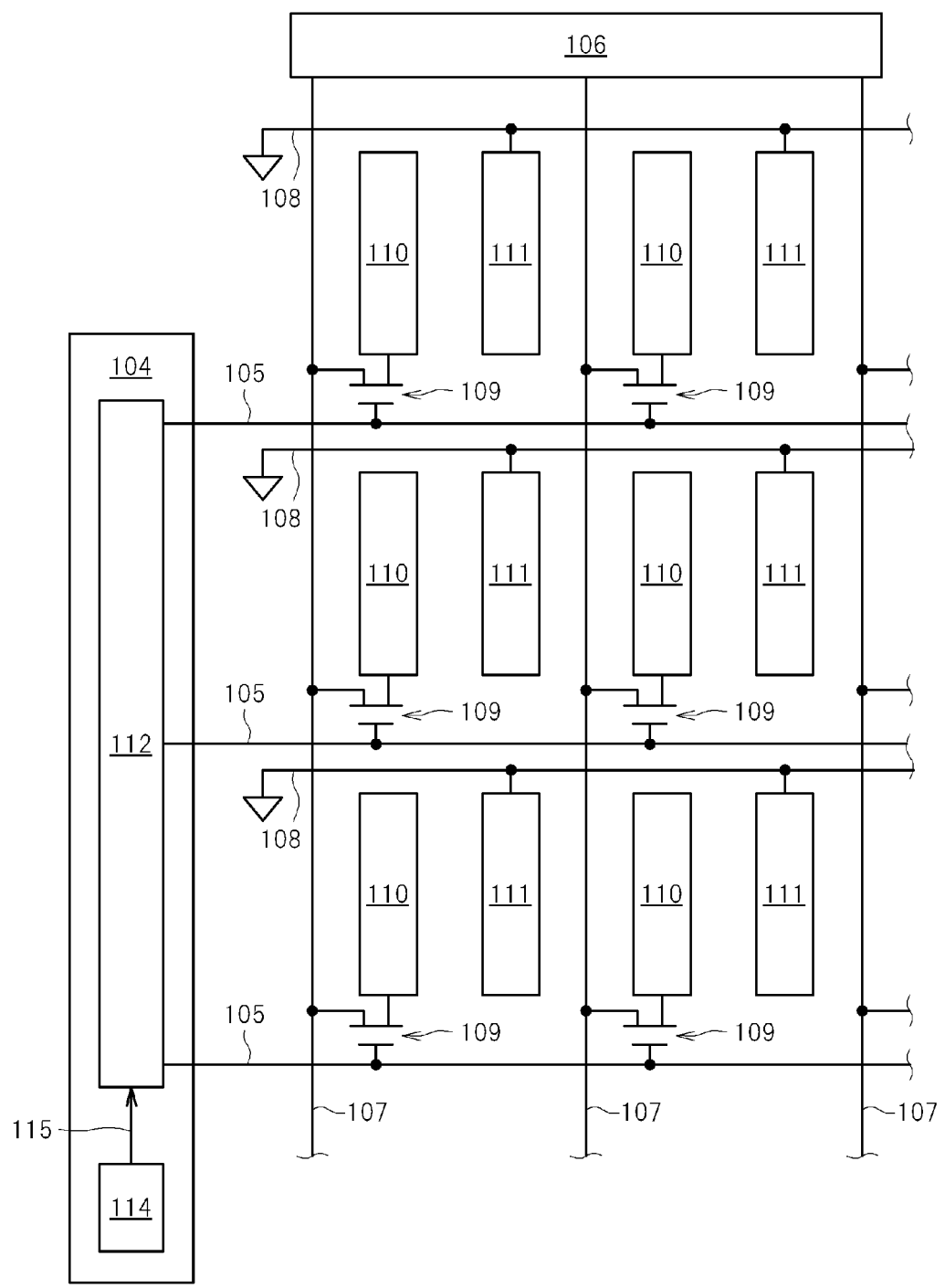
FIG. 2 is a schematic diagram showing an example of an equivalent circuit of a TFT substrate included in the liquid crystal display device according to the embodiment of the invention.

FIG. 2 is a schematic diagram showing an example of an equivalent circuit of the TFT substrate 102. In FIG. 2, on the TFT substrate 102, a number of gate signal lines 105 connected to a gate signal line driving circuit 104 are arranged at equal intervals in a display panel serving as a display region so as to extend in the horizontal direction of the figure.

The gate signal line driving circuit 104 includes a shift register control circuit 114 and a shift register circuit 112. The shift register control circuit 114 outputs a control signal 115 to the shift register circuit 112.

In the shift register circuit 112, a plurality of fundamental circuits 113 is provided so as to correspond to each of the plurality of gate signal lines 105. For example, when 800 gate signal lines 105 are present, 800 fundamental circuits 113 are provided in the shift register circuit 112. Each fundamental circuit 113 outputs a gate signal to the corresponding gate signal line 105 in accordance with the control signal 115 input from the shift register circuit 114. The gate signal has a high voltage (ON voltage) in a corresponding gate scanning period (signal high period) during one frame period and has a low voltage (OFF voltage) in the other period (signal low period).

Moreover, a number of video signal lines 107 connected to a data driving circuit 106 are arranged at equal intervals in the display panel serving as the display region so as to extend in the vertical direction of the figure. In this way, pixel regions which are arranged in a matrix form are partitioned by these gate signal lines 105 and video signal lines 107. The pixel regions constitute the display panel serving as the display region. Moreover, common signal lines 108 extend in the horizontal direction of the figure in parallel to the respective gate signal lines 105.

At a corner of each of the pixel regions which are partitioned by the gate signal lines 105 and the video signal lines 107, the TFT 109 is formed so as to be connected to the video signal line 107 and the pixel electrode 110. Moreover, the gate electrode of the TFT 109 is connected to the gate signal line 105. In each pixel region, the common electrode 111 is formed so as to be connected to the corresponding common signal line 108 and face the pixel electrode 110.

In the circuit configuration, a reference voltage is applied to the common electrode 111 of each pixel circuit through the common signal line 108. Moreover, a gate voltage is selectively applied to the gate electrode of the TFT 109 in accordance with the gate signal supplied to the gate signal line 105, and current flowing into the TFT 109 is controlled. The voltage of a video signal supplied to the video signal line 107 is applied to the pixel electrode 110 through the TFT 109 in which the gate voltage is selectively applied to the gate electrode. In this way, a potential difference occurs between the pixel electrode 110 and the common electrode 111. The alignment of liquid crystal molecules controlled by an electric field generated by the potential difference is changed, whereby the degree of shielding of light from the backlight 103 is changed, and images are displayed.

Figure 3:
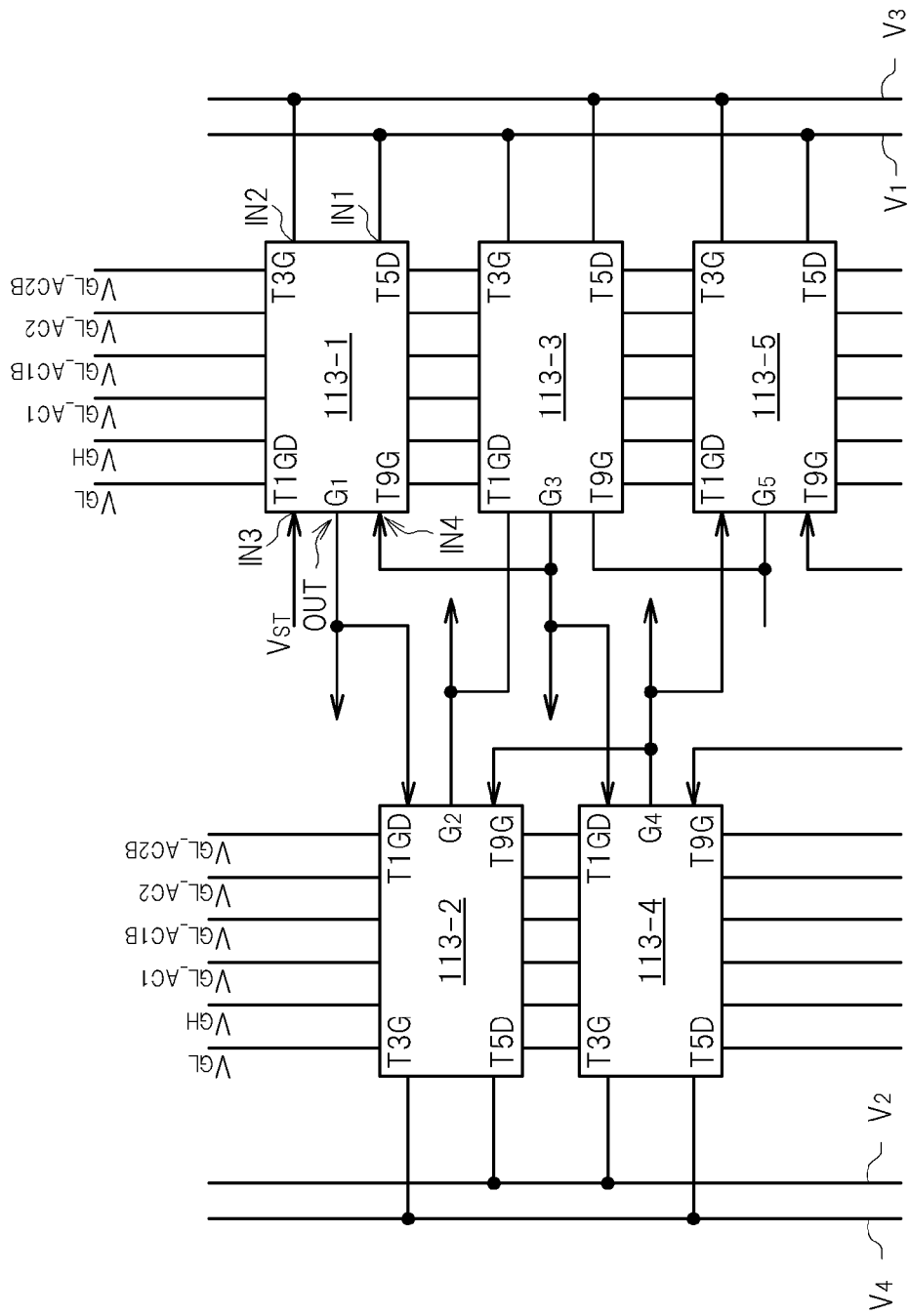
FIG. 3 is a block diagram of a shift register circuit.

FIG. 3 is a block diagram of the shift register circuit 112. For example, when 800 gate signal lines 105 are present, 800 fundamental circuits 113 which correspond to the respective 800 gate signal lines 105 are provided in the shift register circuit 112. FIG. 3 shows five fundamental circuits 113 of n=1 to n=5 among the 800 fundamental circuits 113. In FIG. 3, the n-th fundamental circuit is denoted as a fundamental circuit 113-$n$.

The control signal 115 output from the shift register control circuit 114 to the shift register circuit 112 includes fundamental clock signals $V_1$, $V_2$, $V_3$, and $V_4$ having four different phases, an auxiliary signal $V_{ST}$, and signals which are supplied through a high voltage line $V_{GH}$, a low voltage line $V_{GL}$, and two pairs of AC voltage lines $V_{GL\_AC1}$ and $V_{GL\_AC1B}$ and $V_{GL\_AC2}$ and $V_{GL\_AC2B}$.

As shown in the fundamental circuit 113-1 of FIG. 3, each of the fundamental circuits 113 includes four input terminals IN1, IN2, IN3, and IN4 and one output terminal OUT. Further, the high voltage line $V_{GH}$, the low voltage line $V_{GL}$, and the two pairs of AC voltage lines $V_{GL\_AC1}$ and $V_{GL\_AC1B}$ and $V_{GL\_AC2}$ and $V_{GL\_AC2B}$ are connected to each of the fundamental circuits 113.

The input terminals IN1 and IN2 of the n-th fundamental circuit 113-$n$ will be described. In the n-th fundamental circuit 113-$n$, fundamental clock signals $V_n$ and $V_{n+2}$ are input to the input terminals IN1 and IN2, respectively. Here, the input terminals IN1 and IN2 are connected to any one of the fundamental clock signals having four phases, and even when the value of n is changed, a relation of $V_{n+4}=V_n=V_{n+4}$ must be satisfied.

A gate signal output from the output terminal OUT of the n-th fundamental circuit 113-$n$ will be defined as $G_n$. A gate signal $G_{n-1}$ of a (n−1)th fundamental circuit 113-(n−1) is input to the input terminal IN3 of the n-th fundamental circuit 113-$n$, and similarly, a gate signal $G_{n+2}$ of a (n+2)th fundamental circuit 113-(n+2) is input to the input terminal IN4. The auxiliary signal $V_{ST}$ is input to the input terminal IN3 of the 1st fundamental circuit 113-1 since there is no corresponding gate signal. Similarly, a gate signal $G_{801}$ of a 801st dummy circuit is input to the input terminal IN4 of the 799th fundamental circuit 113-799, and a gate signal $G_{802}$ of a 802nd dummy circuit is input to the input terminal IN4 of the 800th fundamental circuit 113-800. Further, the auxiliary signal $V_{ST}$ is input to the input terminals IN4 of the 801st and 802nd fundamental circuits 113-801 and 113-802.

Figure 4:
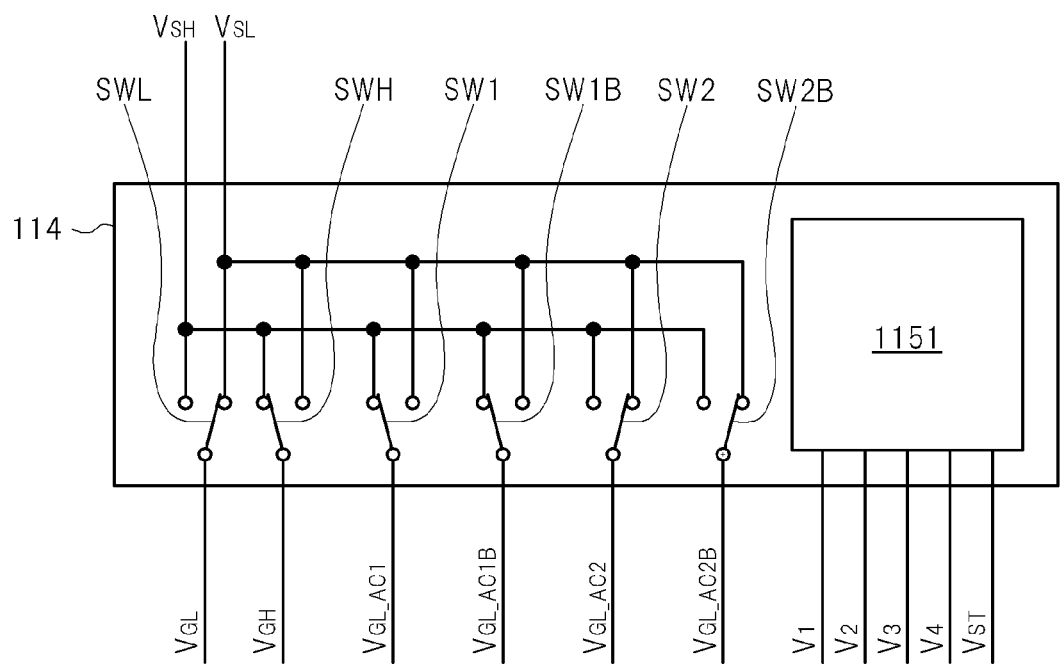
FIG. 4 is a circuit diagram of a shift register control circuit.

FIG. 4 is a circuit diagram of the shift register control circuit 114. The shift register control circuit 114 includes a low voltage conversion switch SWL, a high voltage conversion switch SWH, conversion switches SW1, SW1B, SW2, and SW2B, and a clock signal generation circuit 1151. The low voltage conversion switch SWL, the high voltage conversion switch SWH, and the conversion switches SW1, SW1B, SW2, and SW2B selectively connect one of a high voltage supply line $V_{SH}$ and a low voltage supply line $V_{SL}$ to the low voltage line $V_{GL}$, the AC voltage lines $V_{GL\_AC1}$, $V_{GL\_AC1B}$, $V_{GL\_AC2}$, and $V_{GL\_AC2B}$. Thus, one of the high and low voltages selected by the corresponding switch is supplied to the low voltage line $V_{GL}$, the high voltage line $V_{GH}$, and the AC voltage lines $V_{GL\_AC1}$, $V_{GL\_AC1B}$, $V_{GL\_AC2}$, and $V_{GL\_AC2B}$. The clock signal generation circuit 1151 outputs the fundamental clock signals $V_1$, $V_2$, $V_3$, and $V_4$ and the auxiliary signal $V_{ST}$.

Figure 5:
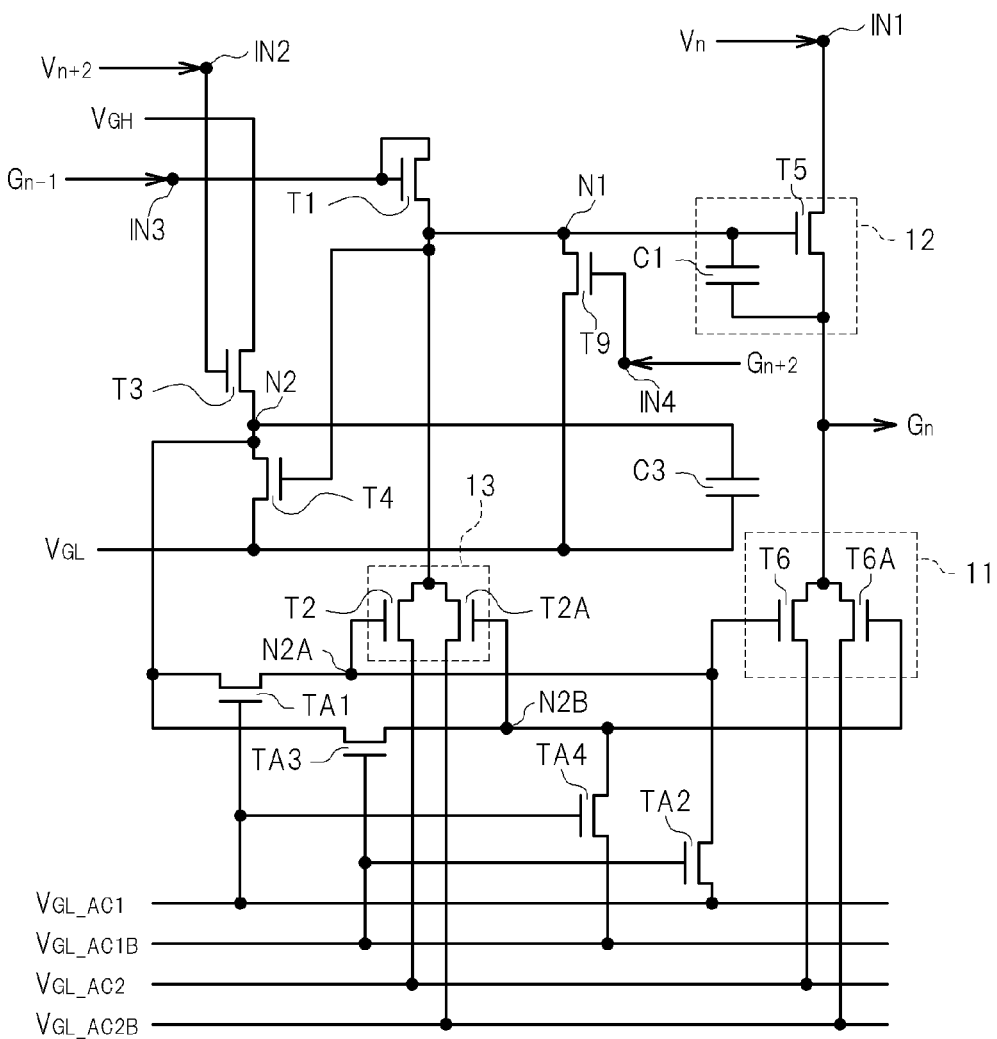
FIG. 5 is a circuit diagram of a fundamental circuit of the shift register circuit.

FIG. 5 is a circuit diagram of the n-th fundamental circuit 113-$n$ of the shift register circuit 112. This fundamental circuit 113-$n$ is different from the fundamental circuit of the shift register circuit according to the related art shown in FIG. 15 in the following two main respects. One difference lies in the fact that in the fundamental circuit of the related art, one transistor T6 corresponding to the low voltage application switching element SWA is provided in the low voltage application switching circuit 211, whereas in the fundamental circuit 113 of the present embodiment, the two transistors of a transistor T6 (corresponding to a first low voltage application switching element) and a transistor T6A (corresponding to a second low voltage application switching element) are provided in a low voltage application switching circuit 11 so as to be connected in parallel to the output terminal OUT. The transistors T6 and T6A output the OFF voltage of the gate signal. The other difference lies in the fact that in the fundamental circuit of the related art, one transistor T2 corresponding to the switching signal supply switching element SWB is provided in the switching signal supply switching circuit 213, whereas in the fundamental circuit 113 of the present embodiment, the two transistors of a transistor T2 (corresponding to a first switching signal supply switching element) and a transistor T2A (corresponding to a second switching signal supply switching element) are provided in a switching signal supply switching circuit 13 so as to be connected in parallel to the node N1.

Moreover, in the fundamental circuit 113 of the present embodiment, the node N2 is connected to a pair of AC voltage lines $V_{GL\_AC1}$ and $V_{GL\_AC1B}$ through transistors TA1, TA2, TA3, and TA4 which serve as control switching elements. Further, another pair of AC voltage lines $V_{GL\_AC2}$ and $V_{GL\_AC2B}$ are connected to the input sides of the transistors T2 and T2A, respectively, and the output sides of the transistors T2 and T2A are both connected to the node N1. Similarly, this pair of AC voltage lines $V_{GL\_AC2}$ and $V_{GL\_AC2B}$ are connected to the input sides of the transistors T6 and T6A, and the output sides of the transistors T6 and T6A are both connected to the output terminal OUT.

The gates (control terminals) of the transistors TA1 and TA3 are connected to the pair of AC voltage lines $V_{GL\_AC1}$ and $V_{GL\_AC1B}$, respectively. The node N2 is connected to nodes N2A and N2B through the transistors TA1 and TA3, respectively, which serve as the control switching elements.

Similarly, the gates of the transistors TA4 and TA2 are connected to the pair of AC voltage lines $V_{GL\_AC1}$ and $V_{GL\_AC1B}$, respectively. The AC voltage line $V_{GL\_AC1}$ and the node N2A are connected through the transistor TA2, and the AC voltage line $V_{GL\_AC1B}$ and the node N2B are connected through the transistor TA4.

The gates of the transistors T2 and T2A are connected to the nodes N2A and N2B, respectively, and similarly, the gates of the transistors T6 and T6A are connected to the nodes N2A and N2B, respectively.

Figure 6:
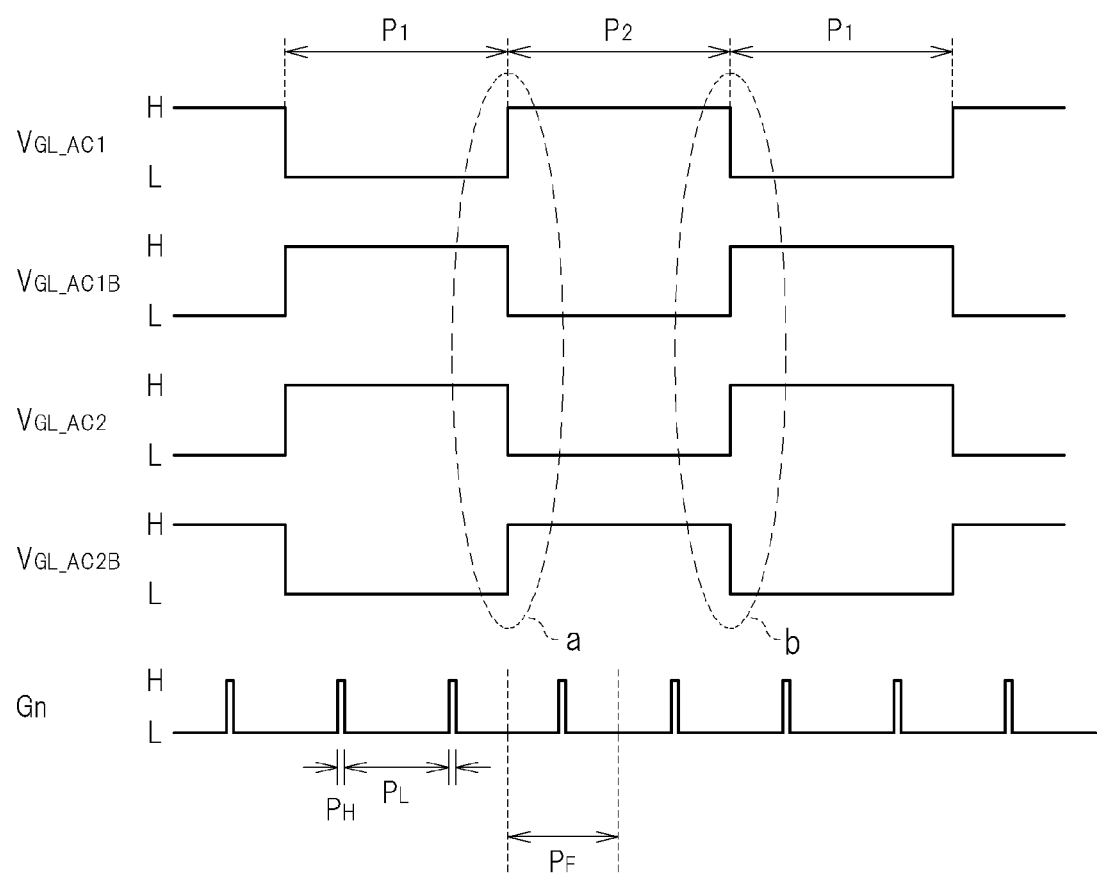
FIG. 6 is a diagram showing changes over time in the voltage of two pairs of AC voltage lines.

FIG. 6 is a diagram showing changes over time in the voltage of two pairs of AC voltage lines together with changes over time in the voltage of the gate signal $G_n$ of a certain fundamental circuit 113-$n$. The horizontal direction represents time, and the vertical direction represents the high and low voltages (H) and (L) of the two pairs of AC voltage lines and the gate signal.

As shown in FIG. 6, the pair of AC voltage lines $V_{GL\_AC1}$ and $V_{GL\_AC1B}$ have nearly opposite phases with each other, and another pair of AC voltage lines $V_{GL\_AC2}$ and $V_{GL\_AC2B}$ also have nearly opposite phases with each other. Further, the AC voltage line $V_{GL\_AC1}$ and the AC voltage line $V_{GL\_AC2}$ also have nearly opposite phases with each other.

That is, as shown in FIG. 6, in a first period $P_1$, the AC voltage lines $V_{GL\_AC1}$ and $V_{GL\_AC2B}$ have a low voltage, and the AC voltage lines $V_{GL\_AC1B}$ and $V_{GL\_AC2}$ have a high voltage. Moreover, in a second period $P_2$ continuous to the first period $P_1$, the AC voltage lines $V_{GL\_AC1}$ and $V_{GL\_AC2B}$ have a high voltage, and the AC voltage lines $V_{GL\_AC1B}$ and $V_{GL\_AC2}$ have a low voltage. The first and second periods $P_1$ and $P_2$ are alternately repeated.

The internal operation of the shift register control circuit 114 during the first and second periods $P_1$ and $P_2$ will be described. During the first period $P_1$, in order to put the transistors TA2 and TA3 into the ON state, the conversion switch SW1B connects the high voltage supply line $V_{SH}$ and the AC voltage line $V_{GL\_AC1B}$ and supplies a high voltage to the gates of the transistors TA2 and TA3. Moreover, the conversion switch SW1 connects the low voltage supply line $V_{SL}$ and the AC voltage line $V_{GL\_AC1}$, supplies a low voltage to the gates of the transistors TA1 and TA4, and puts the transistors TA1 and TA4 into the OFF state. Further, the conversion switch SW2 connects the high voltage supply line $V_{SH}$ and the AC voltage line $V_{GL\_AC2}$, and the conversion switch SW2B connects the low voltage supply line $V_{SL}$ and the AC voltage line $V_{GL\_AC2B}$. During the second period $P_2$, in order to put the transistors TA1 and TA4 into the ON state, the conversion switch SW1 connects the high voltage supply line $V_{SH}$ and the AC voltage line $V_{GL\_AC1}$ and supplies a high voltage to the gates of the transistors TA1 and TA4. Moreover, the conversion switch SW1B connects the low voltage supply line $V_{SL}$ and the AC voltage line $V_{GL\_AC1B}$, supplies a low voltage to the gates of the transistors TA2 and TA3, and puts the transistors TA2 and TA3 into the OFF state. Further, the conversion switch SW2 connects the low voltage supply line $V_{SL}$ and the AC voltage line $V_{GL\_AC2}$, and the conversion switch SW2B connects the high voltage supply line $V_{SH}$ and the AC voltage line $V_{GL\_AC2B}$. Through the first and second periods $P_1$ and $P_2$, the low voltage conversion switch SWL connects the low voltage supply line $V_{SL}$ and the low voltage line $V_{GL}$, and the high voltage conversion switch SWH connects the high voltage supply line $V_{SH}$ and the high voltage line $V_{GH}$.

As shown in FIG. 6, a frame period $P_F$ includes a signal high period $P_H$ where the gate signal $G_n$ has a high voltage and a signal low period $P_L$ where the gate signal $G_n$ has a low voltage. The changes in the voltage of the gate signal $G_n$ are repeated over a cycle of the frame period $P_F$. Therefore, the signal high period $P_H$ is periodically repeated with time, and the gate signal $G_n$ is periodically changed to a high voltage.

In FIG. 6, the first period $P_1$ includes two signal high periods $P_H$ which come in sequence, and the second period $P_2$ continuous to the first period $P_1$ also includes two signal high periods $P_H$, which is the same number as that of the first period $P_1$. The lengths of the first and second periods $P_1$ and $P_2$ are equal, and each length is twice the length of the frame period $P_F$. That is, the changes in the voltages of these two pairs of AC voltage lines are repeated over a cycle of a period for the first and second periods $P_1$ and $P_2$, namely a period of the length four times the length of the frame period $P_F$. Moreover, the conversion of the first and second periods $P_1$ and $P_2$ takes place during the period of the signal low period $P_L$ where the gate signal $G_n$ has a low voltage.

The frame period $P_F$ is a period where video data corresponding to one screen (frame) of a display panel are displayed. Here, in the frame period $P_F$, the respective fundamental circuits 113 sequentially output the gate signal that outputs a high voltage during each signal high period $P_H$. Further, a blanking period is provided between the end of the output of the gate signal by all fundamental circuits 113 and the start of the next frame period $P_F$. That is, the frame period $P_F$ corresponds to a period expressed as (signal high period $P_H$)×(total number of gate signal lines 105)+(blanking period). Since these two pairs of AC voltage lines are connected to the respective fundamental circuits 113 that constitute the shift register circuit 112, it is desirable that in all fundamental circuits 113, the conversion between the first and second periods $P_1$ and $P_2$ is performed during the blanking period which is a period where the gate signal has a low voltage.

In addition, when the conversion from the first period $P_1$ to the second period $P_2$ as indicated by an elliptical circle a in FIG. 6 is performed, the AC voltage lines $V_{GL\_AC1}$ and $V_{GL\_AC2B}$ are both changed from having a low voltage to a high voltage, and the AC voltage lines $V_{GL\_AC1B}$ and $V_{GL\_AC2}$ are both changed from having a high voltage to a low voltage.

There is a minute delay in the time of the changes in these voltages. The same applies to the conversion from the second period $P_2$ to the first period $P_1$ as indicated by an elliptical circle b in FIG. 6. The details of the minute delay will be described later.

In the second period $P_2$, the AC voltage line $V_{GL\_AC1}$ has a high voltage, and the AC voltage line $V_{GL\_AC1B}$ has a low voltage. At that time, as shown in FIG. 6, the transistor TA1 is in the ON state, and the transistor TA2 is in the OFF state. Thus, the node N2A is conducted to the node N2 by the transistor TA1, and is disconnected from the AC voltage line $V_{GL\_AC1}$ by the transistor TA2. Moreover, the node N2B is disconnected from the node N2 by the transistor TA3, and a low voltage of the AC voltage line $V_{GL\_AC1}$ is applied to the node N2B by the transistor TA4. Similarly, in the first period $P_1$, the node N2A is disconnected from the node N2 and maintained at the low voltage, and the node N2B is electrically connected to the node N2.

Here, a driving operation of the n-th fundamental circuit 113-*n* in the second period $P_2$ will be described. As described above, the node N2A is connected to the gates of the transistors T2 and T6, the node N2B is connected to the gates of the transistors T2A and T6A. Thus, in the second period $P_2$, the node N2A is electrically connected to the node N2, and the node N2B is maintained at the low voltage.

The n-th fundamental circuit 113-*n* includes the low voltage application switching circuit 11. The AC voltage line $V_{GL\_AC2}$ is connected to the input side of the transistor T6 which is provided in the low voltage application switching circuit 11. Thus, in the second period $P_2$, the nodes N2 and N2A are changed so as to have a high voltage in response to the signal low period, the high voltage is input to the gate of the transistor T6 as the ON signal, and the transistor T6 is turned ON. As a result, the low voltage of the AC voltage line $V_{GL\_AC2}$ is output by the output terminal OUT as the gate signal $G_n$. In response to the signal high period, the nodes N2 and N2A are changed so as to have a low voltage, and the transistor T6 is turned OFF. In the second period $P_2$, since the node N2B is maintained at the low voltage, the transistor T6A is maintained in the OFF state.

Moreover, the n-th fundamental circuit 113-*n* includes the high voltage application switching circuit 12, and the high voltage application switching circuit 12 includes the transistor T5 which corresponds to the high voltage application switching element SWG and outputs the ON voltage of the gate signal, and the step-up capacitor C1.

The input terminal IN1 is connected to the input side of the transistor T5, and the fundamental clock signal $V_n$ is input to the input terminal IN1. The output side of the transistor T5 is connected to the output terminal OUT of the fundamental circuit. The voltage of the node N1 is applied to the gate of the transistor T5. The node N1 is changed so as to have a high voltage in response to the signal high period. At that time, since the high voltage of the node N1 is applied to the gate of the transistor T5, the transistor T5 is turned ON, and the signal of the fundamental clock signal $V_n$ is output as the gate signal $G_n$ by the output terminal OUT. Moreover, the node N1 is changed so as to have a low voltage in response to the signal low period, and at that time, the transistor T5 is turned OFF.

The switching signal supply switching circuit 13 is a circuit that controls the node N1 so as to have a low voltage. The AC voltage line $V_{GL\_AC2}$ is connected to the input side of the transistor T2 which is provided in the switching signal supply switching circuit 13. In the second period $P_2$, similarly to the transistor T6, the nodes N2 and N2A are changed so as to have a high voltage in response to the signal low period, and the transistor T2 is turned ON. As a result, the low voltage of the AC voltage line $V_{GL\_AC2}$ is applied to the node N1, and the transistor T5 is turned OFF. Moreover, in response to the signal high period, the nodes N2 and N2A are changed so as to have a low voltage, and the transistor T2 is turned OFF. In the second period $P_2$, the node N2B is maintained at the low voltage, and the transistor T2A is maintained in the OFF state.

As described above, the nodes N1 and N2 are changed so as to have the high and low voltages, respectively, in response to the signal high period, and the nodes N1 and N2 are maintained at the low and high voltages, respectively, in response to the signal low period. The other transistors and capacitors shown in FIG. 5 are provided in order to control these nodes.

Figure 7:
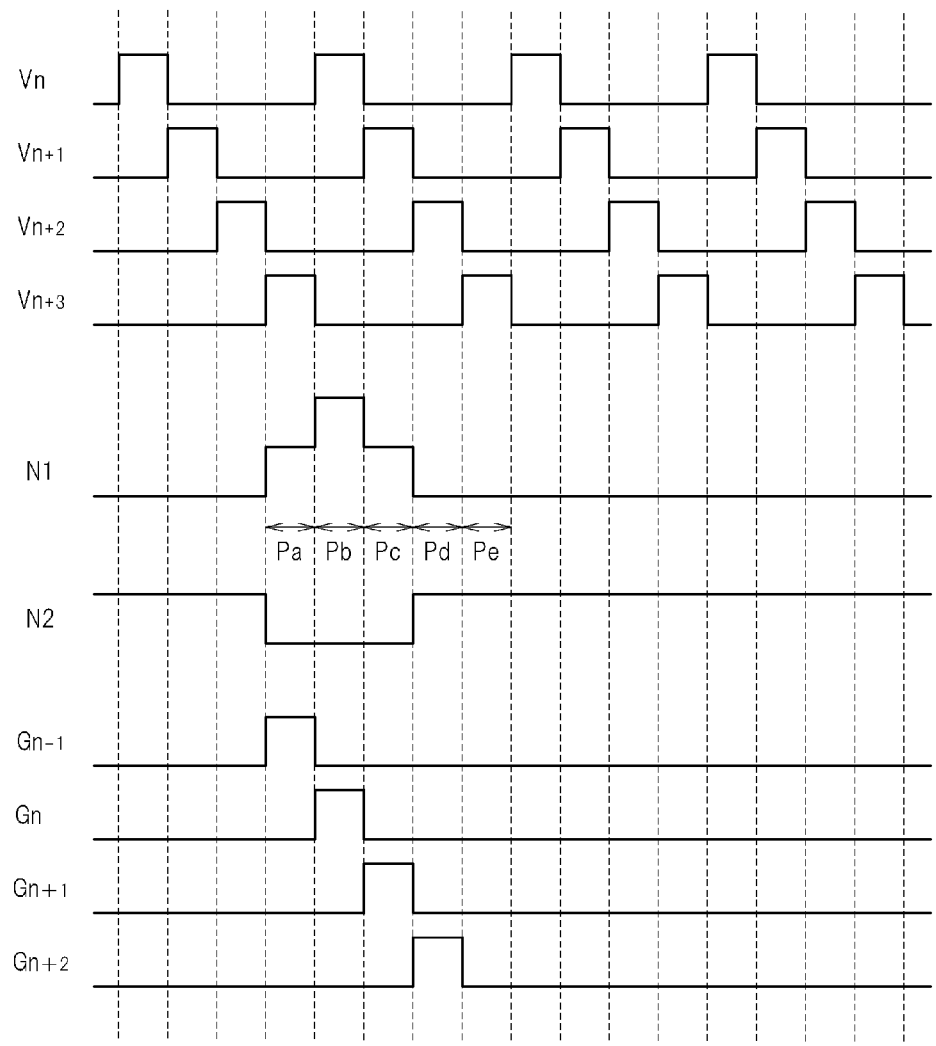
FIG. 7 is a diagram showing changes over time in the voltage of the input signal, node, and gate signal of an n-th fundamental circuit.

FIG. 7 is a diagram showing changes over time in the voltage of the nodes N1 and N2 of the n-th fundamental circuit 113-*n* together with changes over time in the voltage of the fundamental clock signal $V_n$ which is the input signal and the gate signals of adjacent fundamental circuits. The driving operation of the n-th fundamental circuit 113-*n* together with the changes over time in the voltages of the respective signals shown in FIG. 7 will be described.

As shown in FIG. 5, the input terminal IN3 is connected to the gate and the input side of the transistor T1 (it is called "diode-connected"), and the output side of the transistor T1 is connected to the node N1. A gate signal $G_{n-1}$ from a previous fundamental circuit 113-(n−1) is input to the input terminal IN3. In a period Pa shown in FIG. 7, the gate signal $G_{n-1}$ is changed so as to have a high voltage, the transistor T1 is turned ON, and a high voltage is applied to the node N1.

The node N1 is connected to the gate of the transistor T4. In the period Pa, the node N1 is changed so as to have a high voltage, and the transistor T4 is turned ON. The low voltage line $V_{GL}$ is connected to the input side of the transistor T4, and the output side of the transistor T4 is connected to the node N2. Thus, when the transistor T4 is turned ON, the low voltage of the low voltage line $V_{GL}$ is applied to the node N2.

In a period Pb which is a signal high period, the node N1 is maintained at the high voltage, and the transistor T5 is maintained in the ON state. In the period Pb, the fundamental clock signal $V_n$ input to the input terminal IN1 is changed so as to have a high voltage. Therefore, in the period Pb, the high voltage of the fundamental clock signal $V_n$ is output through the transistor T5 by the output terminal OUT as the gate signal $G_n$.

Here, actually, since the transistor T1 has a threshold voltage $V_{th}$, in the period Pa, the voltage of the node N1 is changed to a voltage which is obtained by subtracting the threshold voltage $V_{th}$ of the transistor T1 from the high voltage of the gate signal $G_{n-1}$ from the previous fundamental circuit 113-(n−1). This voltage may not be able to sufficiently allow the transistor T5 to be turned ON in the period Pb which is the signal high period. Thus, in the high voltage application switching circuit 12, the step-up capacitor C1 is connected in parallel with the transistor T5. In other words, the step-up capacitor C1 is provided between the gate and source of the transistor T5. When the period Pb starts, the gate signal $G_{n-1}$ is changed so as to have a low voltage, and the transistor T1 is turned OFF. However, the node N1 is maintained at the high voltage, and the transistor T5 is maintained in the ON state. In the period Pb, the high voltage of the fundamental clock signal $V_n$ input to the input terminal IN1 is applied to the output terminal OUT, and the node N1 is stepped up towards a higher voltage by capacitance coupling of the step-up capacitor C1. This voltage is called a bootstrap voltage.

As described above, since the node N1 is connected to the gate of the transistor T4, during a period when the node N1 has a high voltage, namely the periods Pa, Pb, and Pc, the transistor T4 is maintained in the ON state and outputs the low voltage of the low voltage line $V_{GL}$, and the node N2 is maintained at the low voltage.

As shown in FIG. 5, the low voltage line $V_{GL}$ is connected to the input side of the transistor T9, and the input terminal IN4 is connected to the gate of the transistor T9. The output side of the transistor T9 is connected to the node N1. A gate signal $G_{n+2}$ from a fundamental circuit 113-(n+2) after the next-stage fundamental circuit is input to the input terminal IN4.

As shown in FIG. 7, since the gate signal $G_{n+2}$ is changed so as to have a high voltage in the period Pd, the transistor T9 is turned ON in the period Pd, and the low voltage of the low voltage line $V_{GL}$ is applied to the node N1. As a result, the transistor T5 is turned OFF. Moreover, at the same time, the transistor T4 is also turned OFF.

As shown in FIG. 5, the holding capacitor C3 and the transistor T3 are connected in series between the low voltage line $V_{GL}$ and the high voltage line $V_{GH}$. The output side of the transistor T3 and the positive electrode of the holding capacitor C3 are connected to the node N2. Moreover, the low voltage line $V_{GL}$ is connected to the negative electrode of the holding capacitor C3, and the high voltage line $V_{GH}$ is connected to the input side of the transistor T3. The input terminal IN2 is connected to the gate of the transistor T3, and the fundamental clock signal $V_{n+2}$ is input to the input terminal IN2.

Here, a circuit which includes the holding capacitor C3, the transistor T3 periodically charging the holding capacitor C3, and the transistor T4 resetting the high voltage of the node N2 to a low voltage is called a control voltage output circuit.

Since the fundamental clock signal $V_{n+2}$ is changed so as to have a high voltage in the period Pd, the transistor T3 is turned ON in the period Pd, and the voltage of the node N2 is changed so as to have a high voltage. At the same time, the holding capacitor C3 is charged to a high voltage.

After that, even after in the period Pe, the fundamental clock signal $V_{n+2}$ is changed so as to have a low voltage and the transistor T3 is turned OFF, the voltage of the node N2 is maintained at the high voltage by the holding capacitor C3. Further, the fundamental clock signal $V_{n+2}$ is periodically changed to a high voltage, and at that time, the transistor T3 functions as a charge supply switching element to supply electric charge so as to continue periodically charging the holding capacitor C3. Therefore, the voltage of the node N2 is maintained at the high voltage.

In this way, in response to the signal high period, during the period of Pa, Pb, and Pc, the node N1 is changed so as to have the high voltage, and the transistor T5 which is the high voltage application switching element is turned ON. In that period, the voltage of the fundamental clock signal $V_n$ is output as the gate signal $G_n$ by the output terminal OUT. In particular, since the fundamental clock signal $V_n$ is changed so as to have the high voltage in the period Pb, the gate signal $G_n$ is also changed so as to have the high voltage in that period. Moreover, in that period, the node N2 is changed so as to have the low voltage, and the transistor T6 and the transistor T2 are turned OFF.

Further, in response to the signal low period, in the period other than the periods Pa, Pb, and Pc during one frame period, the node N2 is maintained at the high voltage, and the high voltage is input to the gate of the transistor T2 as the ON signal. As a result, the transistor T2 is turned ON, and the node N1 is maintained at the low voltage. Similarly, the transistor T6 is turned ON, and the low voltage of the AC voltage line $V_{GL\_AC1B}$ is output as the gate signal $G_n$ by the output terminal OUT.

Hereinabove, the driving operation of the n-th fundamental circuit 113-n in the second period $P_2$ has been described. In contrast, in the first period $P_1$, as described above, the node N2A is disconnected from the node N2 and maintained at the low voltage, and the node N2B is electrically connected to the node N2. The node N2B is connected to the gates of the transistors T2A and T6A. In the first period $P_1$, the transistors T2 and T6 are maintained in the OFF state, and the transistors T2A and T6A are turned ON in response to the signal low period to apply the low voltage of the AC voltage line $V_{GL\_AC2B}$ to the node N1 and the output terminal OUT, respectively.

That is, in response to the signal low period, the transistor T6A and the transistor T2A are driven instead of the transistor T6 and the transistor T2. However, another driving operation is the same as the above-described driving operation. The first and second periods $P_1$ and $P_2$ are repeated, and in response to this, the switching elements being driven are sequentially switched.

Figure 8:
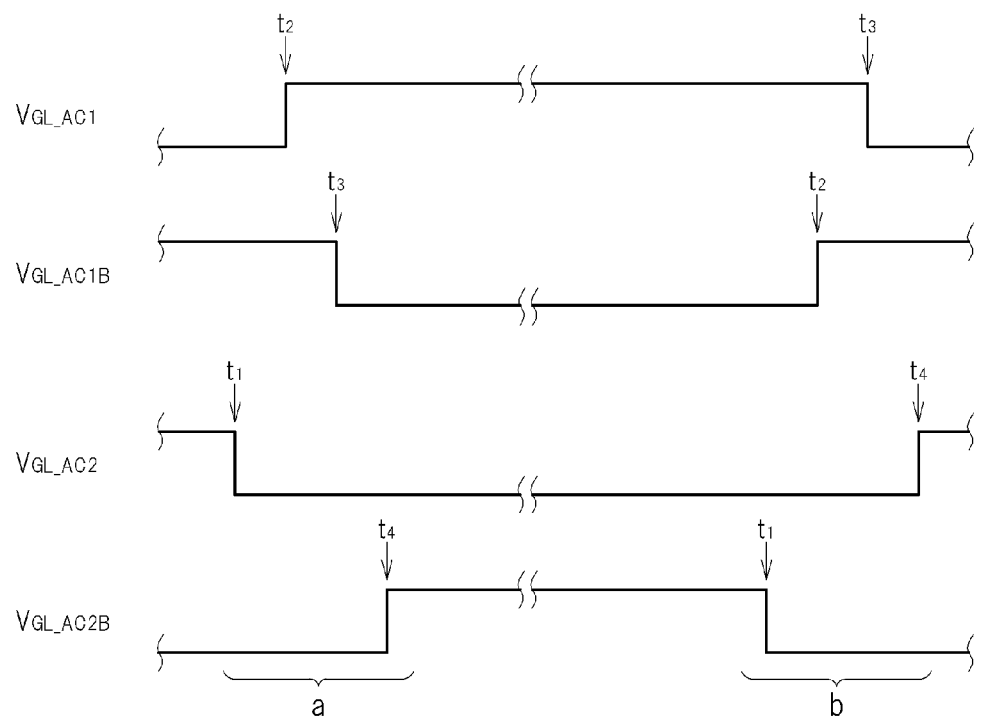
FIG. 8 is a diagram showing changes over time in the voltage of two pairs of AC voltage lines.

FIG. 8 is a diagram showing changes over time in the voltage of two pairs of AC voltage lines. In FIG. 8, the changes over time in the voltage of the two pairs of AC voltage lines shown in FIG. 6 are shown in detail with respect to the times a and b indicated by elliptical circles in FIG. 6. Here, the time a is the time of conversion from the first period $P_1$ to the second period $P_2$ and the time b is the time of conversion from the second period $P_2$ and the first period $P_1$. The times indicated by arrows in the figure are defined as t1, t2, t3, and t4, respectively.

First, the time a, namely the conversion from the first period $P_1$ to the second period $P_2$ will be described.

As described above, in the first period $P_1$, the AC voltage lines $V_{GL\_AC1}$ and $V_{GL\_AC2B}$ have a low voltage, and the AC voltage lines $V_{GL\_AC1B}$ and $V_{GL\_AC2}$ have a high voltage. As described above, in the first period $P_1$, since the node N2B is electrically connected to the node N2, and the node N2A is maintained at the low voltage, the transistor T6A and the transistor T2A are driven. At that time, the transistor T6 and the transistor T2 are maintained in the OFF state.

First, at the time t1, the AC voltage line $V_{GL\_AC2}$ is changed from the high voltage to the low voltage. As a result, the input sides of the transistors T6 and T2 are changes to the low voltage. With a timing delay from that instant, at the time t2, the AC voltage line $V_{GL\_AC1}$ is changed from the low voltage to the high voltage. As a result, the transistor TA1 is turned ON, and the node N2 is electrically connected to the node N2A together with the node N2B. Moreover, the input side of the transistor TA2 which is in the ON state due to the high voltage of the AC voltage line $V_{GL\_AC1B}$ is changed so as to have the high voltage. Before the time t2, the node N2A has a low voltage, and the node N2 has a high voltage, but if the node N2 is just electrically connected to the node N2A in response to the turning ON of the transistor TA1, the voltage of the node N2 will be decreased greatly. However, since the node N2A is changed from the low voltage to the high voltage by the transistor TA2, the decrease in the voltage of the node N2 is suppressed at the time t2. Moreover, since the node N2A and the node N2 are electrically connected, the transistor T6 and the transistor T2 are also driven. Further, the transistor TA4 is also turned ON at the time t2.

Subsequently, at the time t3, the AC voltage line $V_{GL\_AC1B}$ is changed from the high voltage to the low voltage. As a result, the transistor TA3 is turned OFF, and the node N2B is disconnected from the node N2. Moreover, the transistor TA2 is also turned OFF, and the node N2A is disconnected from the AC voltage line $V_{GL\_AC1}$. Further, since the input side of the transistor TA4 which has been in the ON state from the time t2 is changed so as to have the low voltage, the node N2B is changed from the high voltage to the low voltage, and the transistor T6A and the transistor T2A are turned OFF. After that, at the time t4, the AC voltage line $V_{GL\_AC2B}$ is changed from the low voltage to the high voltage. As a result, the input sides of the transistors T6A and T2A are changed so as to have the high voltage.

In this way, in the second period $P_2$, the transistors T6 and T2 are driven, and the transistors T6A and T2A are maintained in the OFF state.

Hereinabove, the time a, namely the conversion from the first period $P_1$ to the second period $P_2$ has been described. However, the same applies to the time b, namely the conversion from the second period $P_2$ to the first period $P_1$. At the time t1, the input sides of the transistors T6A and T2A are changed so as to have the low voltage. After that, at the time t2, the transistors TA3 and TA2 are turned ON, and the node N2B is electrically connected to the node N2 and changed so as to have the high voltage, whereby the transistors T6A and T2A are driven. Subsequently, at the time t3, the transistors TA1 and TA4 are turned OFF, and the node N2A is disconnected from the node N2 and changed so as to have the low voltage, whereby the transistors T6 and T2 are turned OFF. After that, at the time t4, the input sides of the transistors T6 and T2 are changed so as to have the high voltage.

Hereinabove, the configuration and the driving operation of the gate signal line driving circuit according to the present embodiment of the invention and the display device using the same have been described. In the shift register circuit according to the related art shown in FIG. 15, the high voltage is applied over a long period to the gates of the transistors T2 and T6 in response to the signal low period. In contrast, in the fundamental circuit 113 according to the present embodiment shown in FIG. 5, the period where the high voltage is applied to the gate of the transistor is divided between the transistors T2 and T6 and the transistors T2A and T6A. Therefore, it is possible to delay the deterioration start time of the switching element and realize a longer life-span.

Moreover, the period where the high voltage is applied to the gate of the transistor is divided between the transistors T2 and T6 and the transistors T2A and T6A, and each transistor has a period where it is in the OFF state. The Vth shift which occurs when a high voltage is applied to the gate of a transistor and the transistor is in the ON state is alleviated during the period where the transistor is in the OFF state. In this way, the Vth shift of the switching element is suppressed.

The effects of the invention are particularly advantageous when the transistor is a TFT and the semiconductor thin film of the TFT is formed from amorphous silicon (hereinafter referred to as a-Si). This is because the Vth shift is remarkable when a forward bias voltage is applied over a long period to the a-Si TFT. For example, as will be described later, when a forward bias voltage of 30 V is applied for 3 hours to the a-Si TFT under an environment where the element temperature is 70° C., there will be a Vth shift of about 10 V.

Further, if a backward bias voltage is applied when the transistor is in the OFF state, the Vth shift is suppressed further. For example, in the first period $P_1$, the low voltage is applied to the gates of the transistors T2 and T6, and the transistors T2 and T6 are maintained in the OFF state. At that time, the high voltage of the AC voltage line $V_{GL\_AC2}$ is applied to the input sides of the transistors T2 and T6. That is, a voltage higher than a gate voltage is applied to the input sides of the transistors T2 and T6, and a backward bias voltage is applied to both of the transistors T2 and T6. When a backward bias voltage is applied to a transistor, the Vth shift progresses backwards. Therefore, by applying a backward bias voltage to a transistor when the transistor is in the OFF state, the Vth shift is suppressed further.

Further, at the time of the conversion between the first and second periods $P_1$ and $P_2$, since the voltages of the AC voltage lines are changed as shown in FIG. 8, the low voltage is stably output as the gate signal $G_n$ from the output terminal OUT by the two transistors T6 and T6A in response to the signal low period. Similarly, the low voltage is stably applied to the node N1 by the two transistors T2 and T2A. As a result, the noise occurring in the gate signal $G_n$ is suppressed.

For example, as shown in the time a of FIG. 8, at the time of the conversion from the first period $P_1$ to the second period $P_2$, the AC voltage line $V_{GL\_AC2}$ is changed from the high voltage to the low voltage at the time t1, and with a delay from that instant, at the time t2, the AC voltage line $V_{GL\_AC1}$ is changed from the low voltage to the high voltage. As a result, with a delay from the time at which the input sides of the transistor T6 and the transistor T2 are changed from having the high voltage to the low voltage, the two transistors T6 and T2 are turned ON at the time t2. Therefore, the low voltage is stably output from the transistors T6 and T2.

Actually, it takes a little time from the time t2 until the node N2A is stably changed so as to have the high voltage, and it takes a little time until the low voltage is stably output by the threshold voltage $V_{th}$ of each of the two transistors T6 and T2. However, even in this period, the transistor T6A and the transistor T2A are both maintained in the ON state, and the low voltage is stably output. Therefore, the low voltage is stably applied to the output terminal OUT and the node N1.

After that, at the time t3, the AC voltage line $V_{GL\_AC1B}$ is changed from the high voltage to the low voltage, and the transistors T6A and T2A are turned OFF. That is, since the transistors T6 and T2 are turned OFF with a delay from the time at which the transistors T6A and T2A are turned ON, during the period between the times t2 and t3, the transistors T6 and T2 can be put into a state near the state in which they are sufficiently turned ON.

At the time t3, the AC voltage line $V_{GL\_AC1B}$ is changed from the high voltage to the low voltage, and the transistor TA3 is turned OFF, whereby the node N2B is disconnected from the node N2. At the same time, the node N2B is changed so as to have the low voltage by the transistor TA4. Since the node N2B is changed so as to have the low voltage, the two transistors T6A and T2A are turned OFF. Actually, it takes a little time from the time t3 until the node N2B is stably changed so as to have the low voltage, and it takes a little time until the two transistors T6A and T2A are stably turned OFF by the threshold voltage $V_{th}$ thereof. However, at that time, since the AC voltage line $V_{GL\_AC2B}$ is maintained at the low voltage, the low voltage is output even when the transistors T6A and T2A are not sufficiently turned OFF.

After that, at the time t4, the AC voltage line $V_{GL\_AC2B}$ is changed from the low voltage to the high voltage. That is, since the input sides of the transistors T6A and T2A are changed so as to have the high voltage with a delay from the time at which the transistors T6A and T2A are turned OFF, during the period between the times t3 and t4, the transistors T6A and T2A can be put into a state near the state where they are sufficiently turned OFF. After the time t4, in the second period $P_2$, the high voltage is applied to the input sides of the transistors T6A and T2A which were in the OFF state. That is, since a backward bias voltage is applied to the transistors T6A and T2A, the Vth shift is suppressed further.

Hereinabove, the changes in the voltage of the AC voltage line at the time of the conversion from the first period $P_1$ to the second period $P_2$ indicated as the time a in FIG. 8 have been described. The same applies to the changes in the voltage of the AC voltage line at the time of the conversion from the second period $P_2$ to the first period $P_1$ indicated as the time b in FIG. 8.

As shown in FIG. 8, as the voltage of the AC voltage line changes over time, at the time of the conversion between the first and second periods $P_1$ and $P_2$, the low voltage is more stably output from the low voltage application switching circuit 11 to the output terminal OUT, and the low voltage is more stably applied from the switching signal supply switching circuit 13 to the node N1.

If the node N1 is not sufficiently maintained at the low voltage, the transistor T5 is partially turned ON in response to the signal low period, and the signal of the fundamental clock signal $V_n$ may be applied to the gate signal $G_n$ as noise in response to the signal low period without being sufficiently blocked. However, in this shift register circuit, since the node N1 is stably maintained at the low voltage in response to the signal low period, the noise in the gate signal $G_n$ is suppressed. Moreover, if the low voltage is not stably applied to the output terminal OUT in response to the signal low period, it may be not possible to absorb noise generated through the transistor T5 or noise generated outside the fundamental circuit. However, in the shift register circuit, since the low voltage is stably applied to the output terminal OUT in response to the signal low period, noise in the gate signal $G_n$ is suppressed further.

Hereinabove, the operation when the liquid crystal display device displays an image in the first and second periods $P_1$ and $P_2$ and other periods has been described. In the following, the operation of resetting the above-described fundamental circuit when the liquid crystal display device is started will be described.

Figure 9:
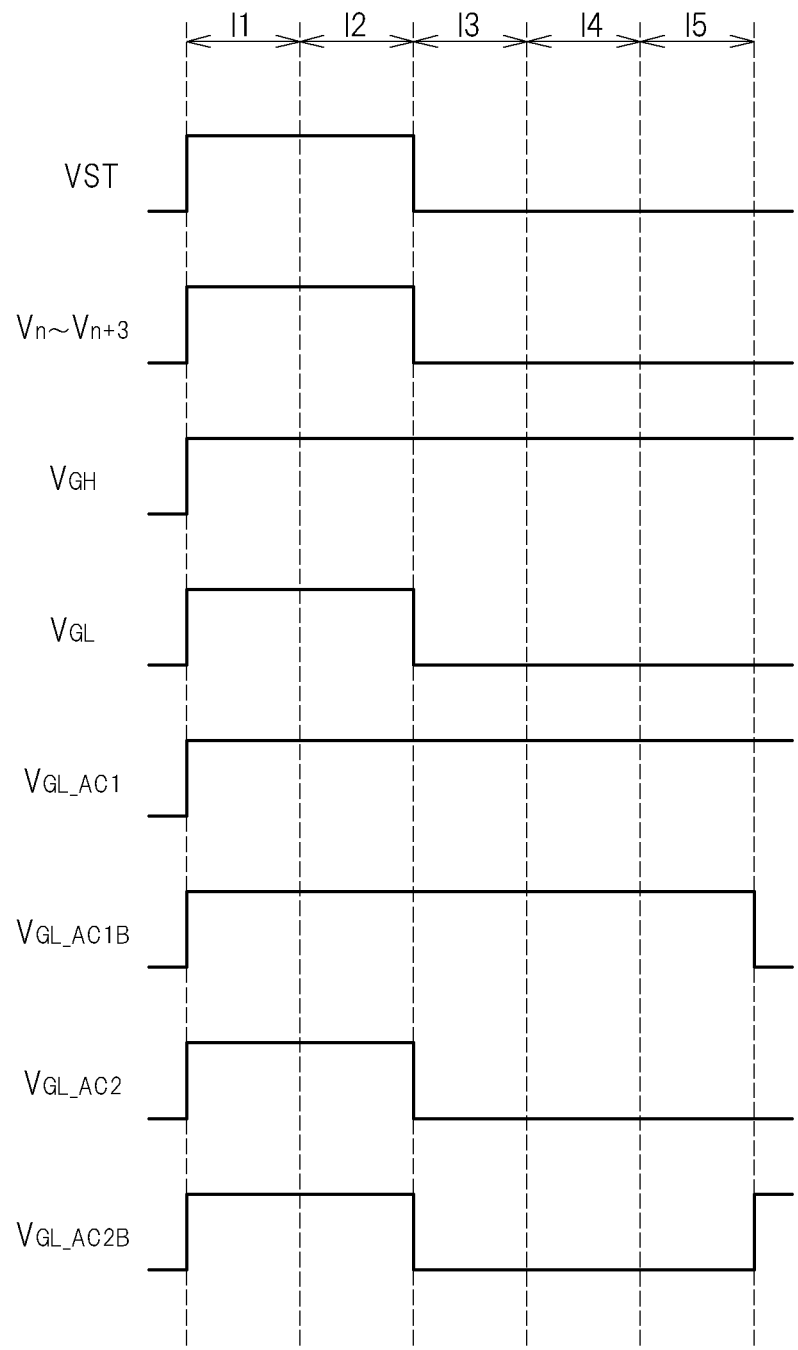
FIG. 9 is a waveform diagram showing signals input to the fundamental circuit during the startup.

FIG. 9 is a waveform diagram showing signals input to the fundamental circuit 113 during the startup. From top down, signals applied to the lines transmitting the auxiliary signal $V_{ST}$, the fundamental clock signals $V_n$, $V_{n+1}$, $V_{n+2}$, and $V_{n+3}$, signals applied to the high voltage line $V_{GH}$, signals applied to the low voltage line $V_{GL}$, and signals applied to each of the AC voltage lines $V_{GL\_AC1}$, $V_{GL\_AC1B}$, $V_{GL\_AC2}$, and $V_{GL\_AC2B}$ are shown. A voltage of the Vcc level (in the present embodiment, the same as the high voltage) is applied to all the lines shown in FIG. 9 in a period I1 where a reset before the startup of the gate signal line driving circuit 104 is performed and a subsequent period I2 where a startup preparation is performed. Subsequently, in a period I3 where the startup is being performed, a period I4 where a startup completion process is performed, and a period I5 where the startup ends and a non-display mode begins, the high voltage is applied to the high voltage line $V_{GH}$, the low voltage is applied to the low voltage line $V_{GL}$, the high voltage is applied to the AC voltage lines $V_{GL\_AC1}$ and $V_{GL\_AC1B}$, and the low voltage is applied to the AC voltage lines $V_{GL\_AC2}$ and $V_{GL\_AC2B}$. Here, the period from I3 to I5 will be collectively called a startup period. The display period begins after the period I5, and the display period includes the first and second period $P_1$ and $P_2$. Although the periods I1 to I5 are illustrated as having the same length in FIG. 9 for better understanding, actually, the lengths of the periods I1 to I5 may be changed in accordance with a period necessary for each process.

The operation of the fundamental circuit 113 in the startup period will be described. In this period, the transistors TA1, TA2, TA3, and TA4 are supplied with a control switch-ON signal (the high voltage in the present embodiment) and are put into the ON state because the gates of the transistors TA1, TA2, TA3, and TA4 are connected to the AC voltage lines $V_{GL\_AC1}$ and $V_{GL\_AC1B}$. The high voltage of the AC voltage lines $V_{GL\_AC1}$ and $V_{GL\_AC1B}$ is supplied to the node N2 through the transistors TA1 and TA2 or the transistors TA3 and TA4. A potential difference is generated between both ends of the holding capacitor C3 by the supplied high voltage, and the holding capacitor C3 stores electric charge which supplies the high voltage to the node N2 side thereof. Moreover, the transistors T2 and T2A are also put into the ON state, and accordingly, the display period begins after that moment. Thus, the low voltage from the AC voltage lines $V_{GL\_AC2}$ and $V_{GL\_AC2B}$ is supplied to the node N1. That is, it is not always necessary to apply the low voltage to the AC voltage lines $V_{GL\_AC2}$ and $V_{GL\_AC2B}$ in order to change the node N1 to have the low voltage. This is because the node N1 is changed so as to have the low voltage by the high voltage of the node N2 in the display period.

The internal state of the shift register control circuit 114 in the startup period will be described. The conversion switch SW1 connects the high voltage supply line $V_{SH}$ and the AC voltage line $V_{GL\_AC1}$, and the conversion switch SW1B connects the high voltage supply line $V_{SH}$ and the AC voltage line $V_{GL\_AC1B}$. Moreover, the conversion switch SW2 connects the low voltage supply line $V_{SL}$ and the AC voltage line $V_{GL\_AC2}$, and the conversion switch SW2B connects the low voltage supply line $V_{SL}$ and the AC voltage line $V_{GL\_AC2B}$. The low voltage conversion switch SWL connects the low voltage supply line $V_{SL}$ and the low voltage line $V_{GL}$, and the high voltage conversion switch SWH connects the high voltage supply line $V_{SH}$ and the high voltage line $V_{GH}$. In this way, the signals shown in FIG. 9 are supplied to the respective lines.

Figure 15:
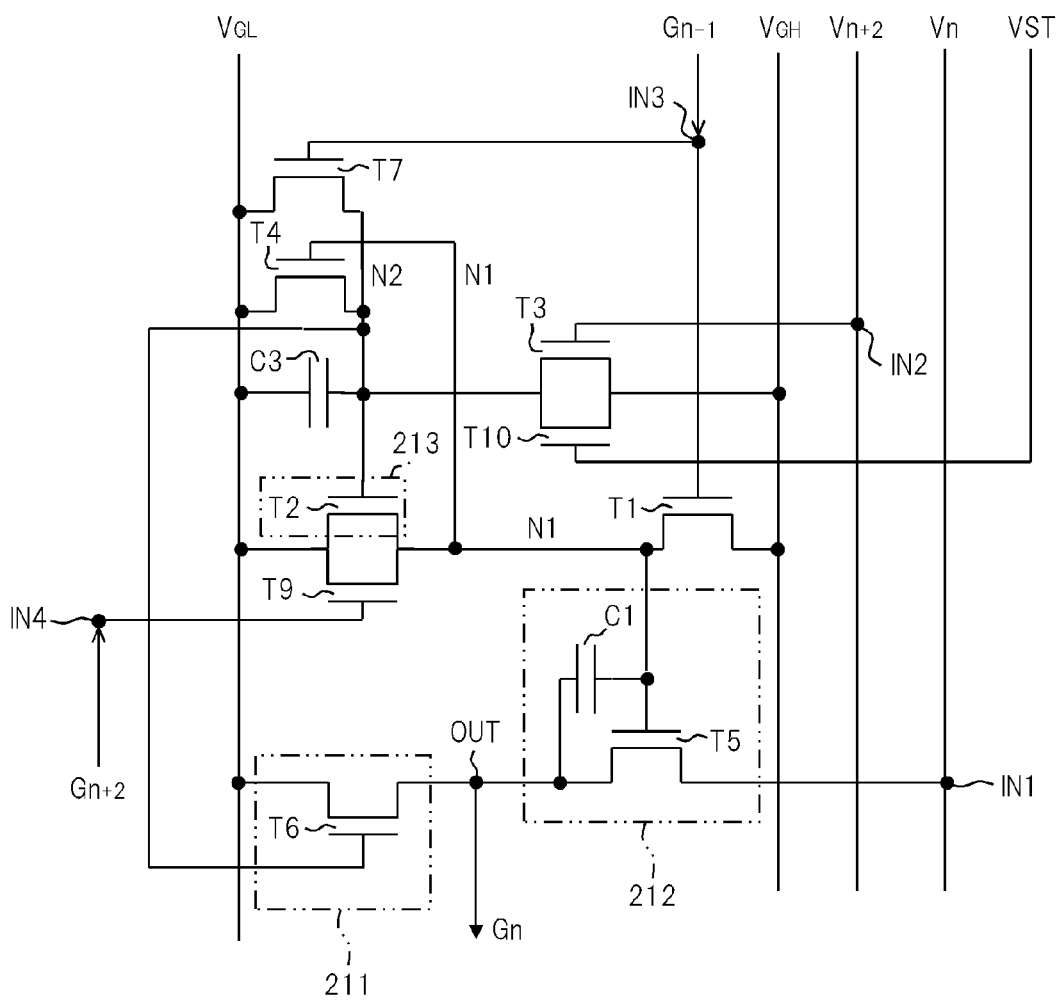
FIG. 15 is a circuit diagram showing an example of the fundamental circuit of the shift register circuit according to the related art.

By doing so, even without the transistor T10 which resets the node N2 like the fundamental circuit 113 of the liquid crystal display device of the related art as shown in FIG. 15, it is possible to supply the high voltage as an initial voltage that puts the node N2 into an initial state. Then, the transistor T10 is not needed, and the Vth shift problem is eliminated.

Moreover, in the startup period, the high voltage is applied to the gates of the transistors T2, T2A, T6, and T6A, and the low voltage from the AC voltage lines $V_{GL\_AC2}$ and $V_{GL\_AC2B}$ is applied to the source and drain thereof. As a result, the threshold voltage Vth of the transistors T2, T2A, T6, and T6A is shifted in the positive direction. When these transistors are depleted in the initial state after being manufactured and a leakage current is generated, the depletion can be eliminated. The application of the low voltage to the AC voltage lines $V_{GL\_AC2}$ and $V_{GL\_AC2B}$ is not limited to the startup period. The low voltage may be applied in the display period until the depletion is eliminated. Even in this case, operation is trouble free. Whether or not to eliminate the depletion may be determined by using a method of monitoring the Vth shift of a TEG-TFT or performing time-control or the like.

In the present embodiment, although in the first or second period $P_1$ or $P_2$, the Vth shift of the transistor TA2 or TA4 is controlled so as to occur in both directions, the threshold voltage Vth of the transistor TA2 or TA4 is shifted in the positive direction due to the characteristics of a transistor. Thereupon, there is a possibility that the high voltage is not sufficiently supplied towards the node N2 at the time of startup, the node N2 is not changed so as to have the high voltage. However, since the high voltage is applied to the high voltage line $V_{GH}$ in the startup period, and the fundamental clock signal $V_{n+2}$ has the low voltage, the threshold voltage Vth of the transistor T3 is shifted in the negative direction. By doing so, when the transistor T3 is depleted, the high voltage can be supplied from the high voltage line $V_{GH}$ to the node N2 at the time of the startup, and the occurrence of the above-described problem can be suppressed.

Figure 10:
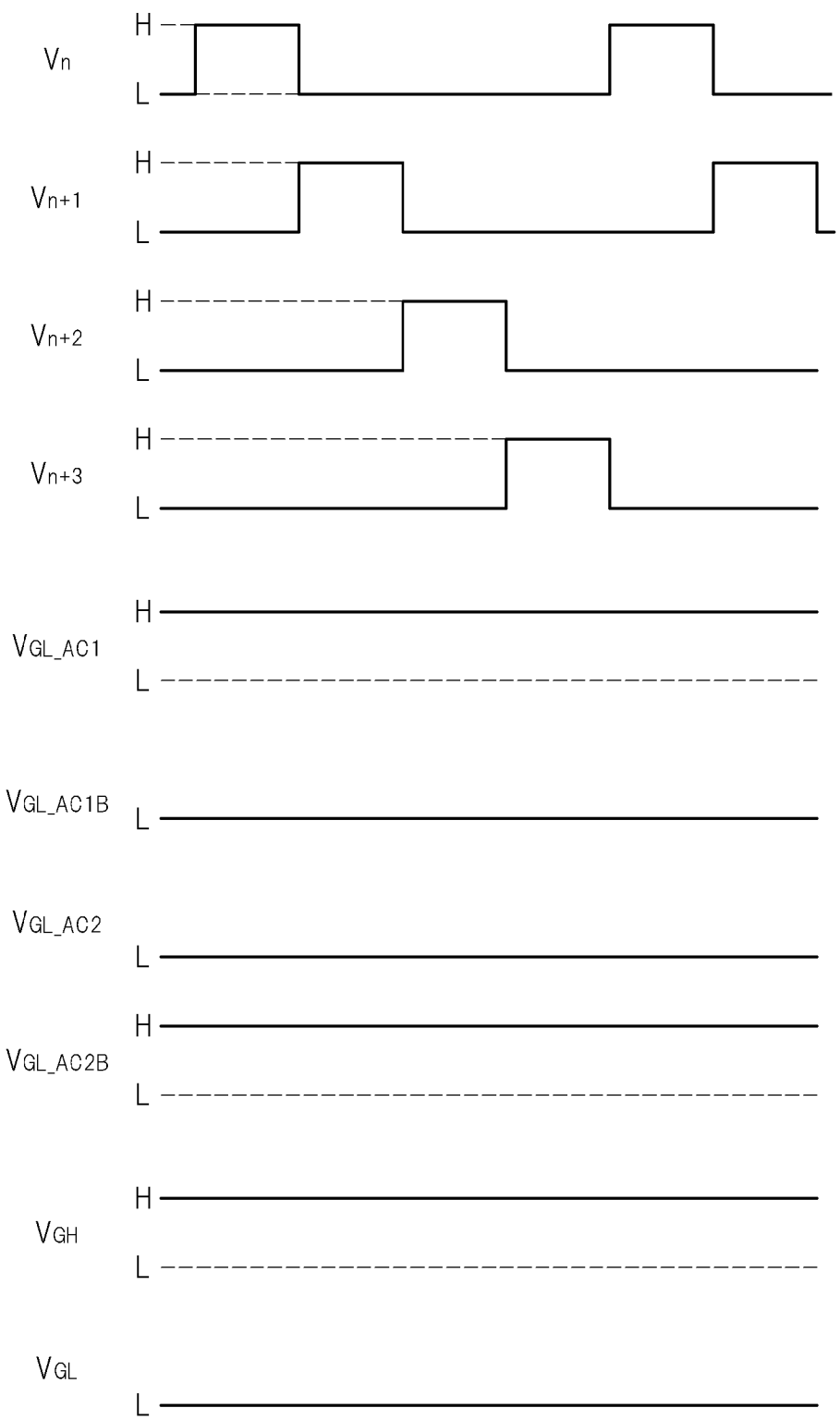
FIG. 10 is a waveform diagram showing signals input to the fundamental circuit during normal operation.
Figure 11:
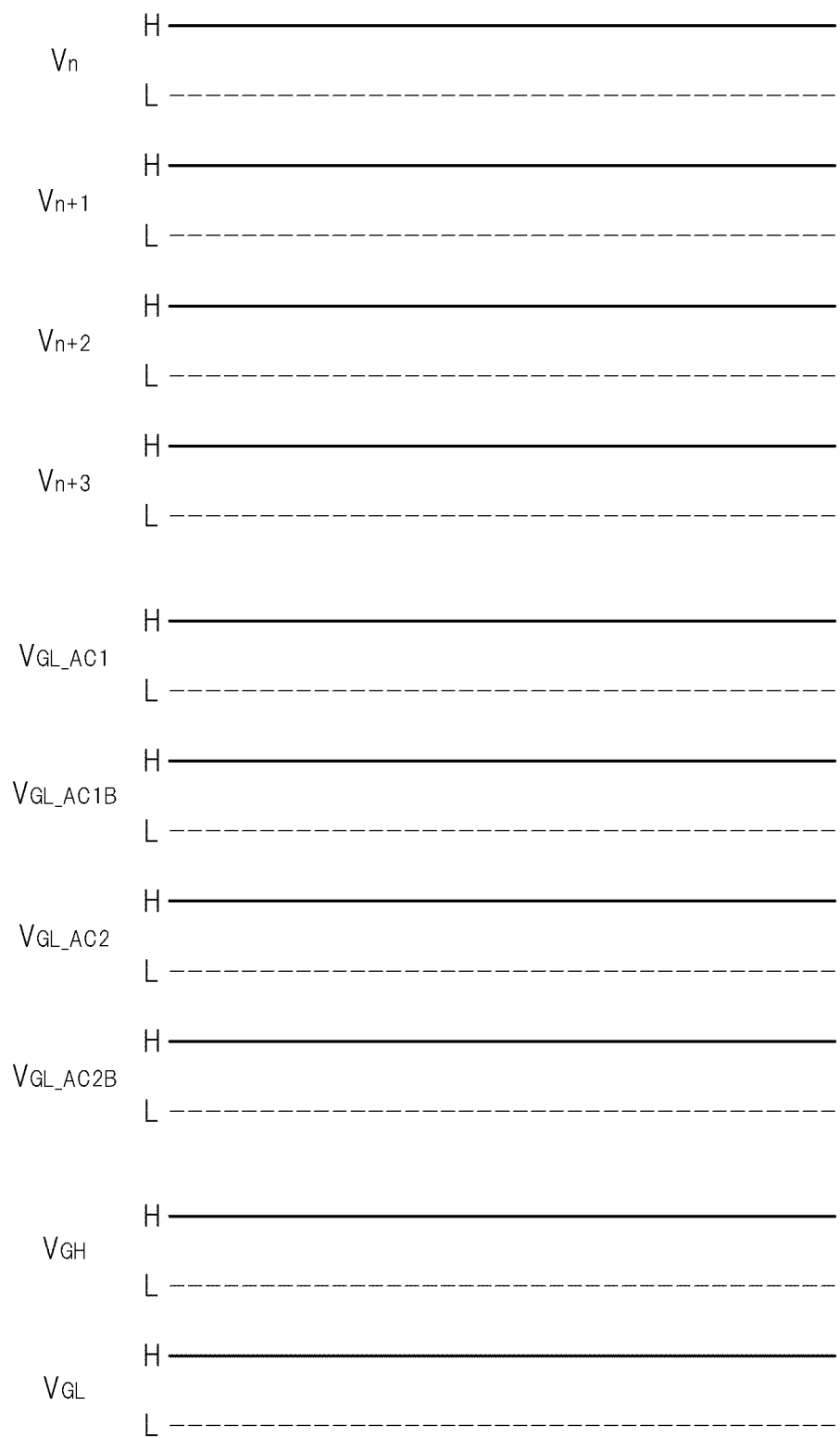
FIG. 11 is a waveform diagram showing signals input to the fundamental circuit during power-down.

Next, the operation when the power supply powers down suddenly due to dropout of a battery pack or the like will be described. FIG. 10 is a waveform diagram showing signals input to the fundamental circuit 113 during a normal operation. The fundamental clock signals $V_n$, $V_{n+1}$, $V_{n+2}$, and $V_{n+3}$ are sequentially changed so as to have the high voltage, and after that, the fundamental clock signal $V_n$ is changed again to the high voltage, and such an operation is repeated. The high voltage is supplied to the high voltage line $V_{GH}$ and the low voltage is supplied to the low voltage line $V_{GL}$. The two pairs of the AC voltage lines $V_{GL\_AC1}$ and $V_{GL\_AC1B}$ and $V_{GL\_AC2}$ and $V_{GL\_AC2B}$ are each supplied with the voltage as described above depending on whether it is in the first period $P_1$ or the second period $P_2$. FIG. 11 is a waveform diagram showing signals input to the fundamental circuit 113 during power-down. A power supply circuit of the liquid crystal display device detects a power-down and transmits a reset signal to a driver IC (the shift register control circuit 114). Upon receiving the reset signal, the shift register control circuit 114 outputs the high voltage as fundamental clock signals $V_n$, $V_{n+1}$, $V_{n+2}$, and $V_{n+3}$, the signals supplied through the two pairs of AC voltage lines $V_{GL\_AC1}$ and $V_{GL\_AC1B}$ and $V_{GL\_AC2}$ and $V_{GL\_AC2B}$, and the signals of the high voltage line $V_{GH}$ and the low voltage line $V_{GL}$. Further, if the potential of the common signal line 108 and the potential of the video signal line 107 are added, since the gate signal line has a high voltage, and the TFT 109 is put into the ON state, the voltage applied to the liquid crystals can be pulled down. By doing so, it is possible to prevent deterioration of the display quality during restart due to a DC component of the voltage applied to the liquid crystals. That is, instead of detecting a power-down of the power supply circuit, a decrease in the power supply voltage of the shift register control circuit may be detected.

In this case, the internal state of the shift register control circuit 114 is as follows. The conversion switch SW1 connects the high voltage supply line $V_{SH}$ and the AC voltage line $V_{GL\_AC1}$, and the conversion switch SW1B connects the high voltage supply line $V_{SH}$ and the AC voltage line $V_{GL\_AC1B}$. Moreover, the conversion switch SW2 connects the high voltage supply line $V_{SH}$ and the AC voltage line $V_{GL\_AC2}$, and the conversion switch SW2B connects the high voltage supply line $V_{SH}$ and the AC voltage line $V_{GL\_AC2B}$. The low voltage conversion switch SWL connects the high voltage supply line $V_{SH}$ and the low voltage line $V_{GL}$, and the high voltage conversion switch SWH connects the high voltage supply line $V_{SH}$ and the high voltage line $V_{GH}$. By connecting the high voltage supply line $V_{SH}$ and the low voltage line $V_{GL}$, it is possible to obviate the current leakage path and more reliably extract the voltage applied to the liquid crystals.

Figure 12:
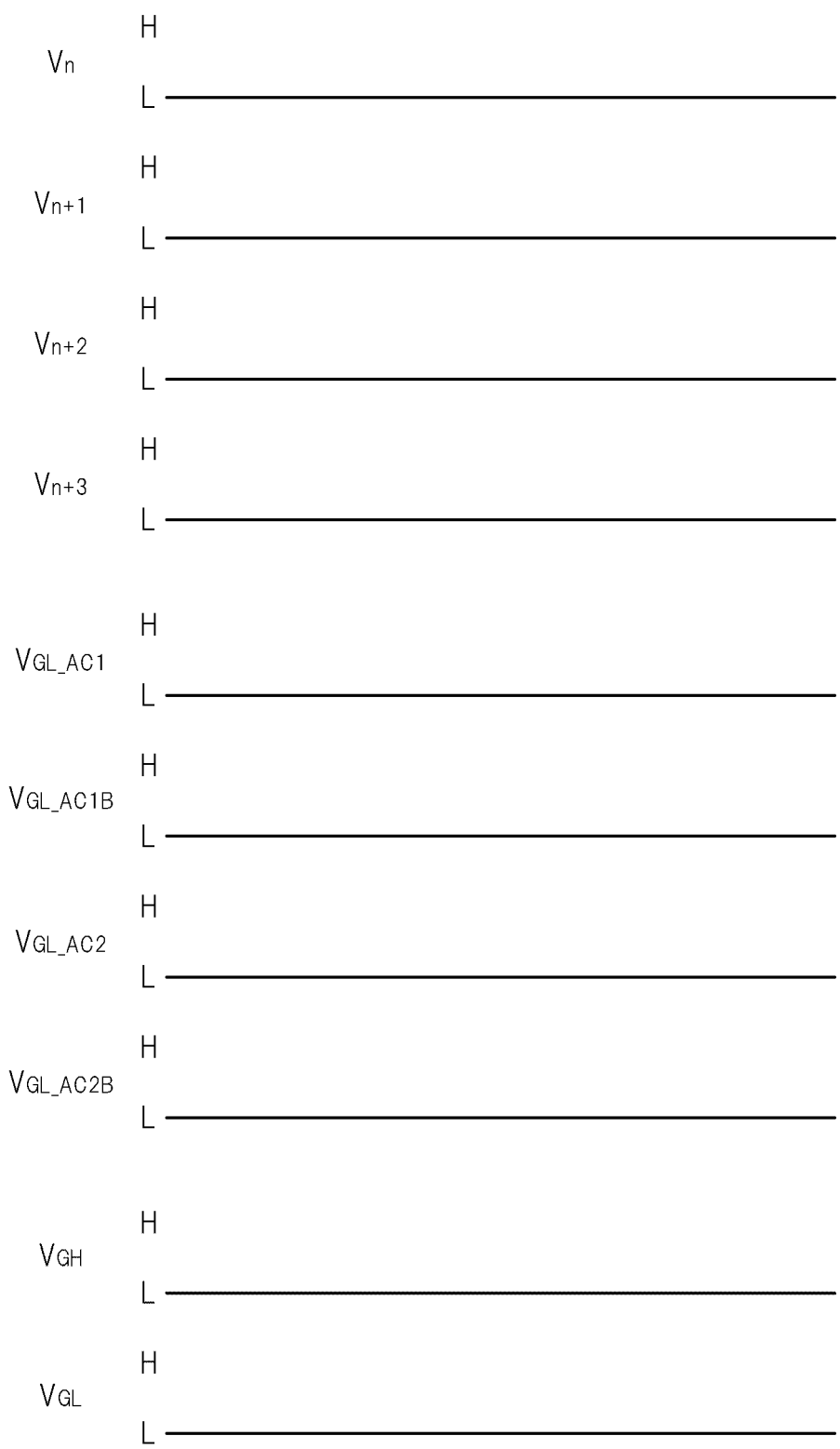
FIG. 12 is a waveform diagram showing signals input to the fundamental circuit during power standby.

Next, the operation during standby will be described. FIG. 12 is a waveform diagram showing signals input to the fundamental circuit 113 during power standby. During the standby, the shift register control circuit 114 outputs the low voltage as the fundamental clock signals $V_n$, $V_{n+1}$, $V_{n+2}$, and $V_{n+3}$, the signals supplied through the two pairs of AC voltage lines $V_{GL\_AC1}$ and $V_{GL\_AC1B}$ and $V_{GL\_AC2}$ and $V_{GL\_AC2B}$, and the signals of the high voltage line $V_{GH}$ and the low voltage line $V_{GL}$.

In this case, the internal state of the shift register control circuit 114 is as follows. The conversion switch SW1 connects the low voltage supply line $V_{SH}$ and the AC voltage line $V_{GL\_AC1}$, and the conversion switch SW1B connects the low voltage supply line $V_{SL}$ and the AC voltage line $V_{GL\_AC1B}$. Moreover, the conversion switch SW2 connects the low voltage supply line $V_{SL}$ and the AC voltage line $V_{GL\_AC2}$, and the conversion switch SW2B connects the low voltage supply line $V_{SL}$ and the AC voltage line $V_{GL\_AC2B}$. The low voltage conversion switch SWL connects the low voltage supply line $V_{SL}$ and the low voltage line $V_{GL}$, and the high voltage conversion switch SWH connects the low voltage supply line $V_{SL}$ and the high voltage line $V_{GH}$. By supplying the low voltage to the two pairs of AC voltage lines $V_{GL\_AC1}$ and $V_{GL\_AC1B}$ and $V_{GL\_AC2}$ and $V_{GL\_AC2B}$ and the high voltage line $V_{GH}$, it is possible to obviate the current leakage path in the fundamental circuit 113 and suppress current consumption.

Hereinabove, the gate signal line driving circuit and the display device according to the present embodiment of the invention have been described. In the fundamental circuit 113 shown in FIG. 5, two transistors are connected in parallel in each of the low voltage application switching circuit 11 and the switching signal supply switching circuit 13. This is to cause the period where the high voltage is applied to be divided between two transistors in both the low voltage application switching element and the switching signal supply switching element in which the high voltage is applied to the gates over a long period. The invention is particularly advantageous because the Vth shift or the like is suppressed in all of the transistors in which the high voltage is applied to the gates among the transistors provided in the fundamental circuit 113.

However, two transistors may be connected in parallel in any one of the low voltage application switching element and the switching signal supply switching element. That is, in the fundamental circuit according to the related art shown in FIG. 15, two transistors T6 and T6A may be provided in the low voltage application switching circuit. Similarly, two transistors T2 and T2A may be provided in the switching signal supply switching circuit. In any of the cases, in each of the two transistors provided in parallel in the circuit, the Vth shift is suppressed, and the advantage of the present invention is obtained.

Moreover, in the fundamental circuit 113 according to the present embodiment shown in FIG. 5, during a period when the transistors provided in the low voltage application switching circuit 11 and the switching signal supply switching circuit 13 are not driven and are in the OFF state, a backward bias voltage is applied to the transistors. Therefore, although the Vth shift is suppressed further, the backward bias voltage is not always necessary. Even when the input sides of the transistors are connected to the low voltage line $V_{GL}$, the effect of suppressing the Vth shift is obtained.

Further, in the fundamental circuit 113 according to the present embodiment shown in FIG. 5, although two transistors are provided in parallel in each of the low voltage application switching circuit 11 and the switching signal supply switching circuit 13, the number of transistors is not limited to two. The number may be increased to three, four, and further. In that case, the number of pairs of AC voltage lines connected so as to correspond to the respective nodes may be increased to three, four, and further. For example, when three transistors are provided, a case where one of the three transistors is driven and the other two transistors are turned OFF and a case where two of the three transistors are driven and the other transistor is turned OFF may be considered. However, in any of the cases, by using the periods before and after the conversion of a switching element being driven as the first and second periods, respectively, and using the switching elements driven before and after the conversion as the first and second switching elements, respectively, the invention can be applied similarly to the case of the present embodiment, and the advantages of the invention are obtained.

Although the shift register circuit 112 according to the embodiment of the invention has the fundamental circuits 113 all of which are disposed on one side of the display region as shown in FIG. 2, the invention is not limited to this configuration. For example, the fundamental circuits 113 may be disposed on both of the left and right sides of the display region. For example, when 800 gate signal lines 105 are present, 400 fundamental circuits 113 may be provided on each side. In this case, for example, the fundamental circuits 113 on the right side may supply the gate signal to the odd-numbered signal lines, and the fundamental circuits 113 on the left side may supply the gate signal to the even-numbered signal lines.

Figure 13:
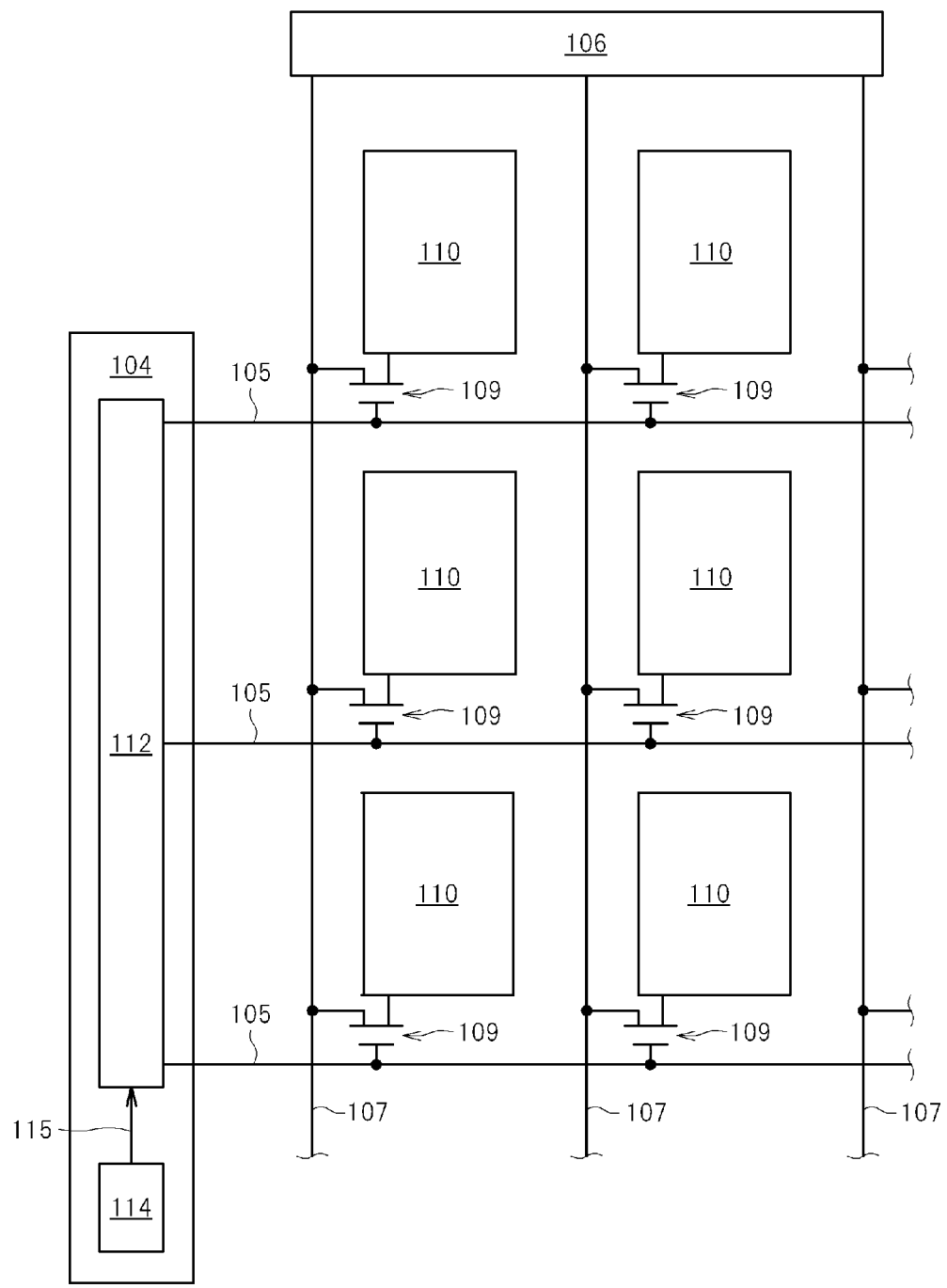
FIG. 13 is a schematic diagram showing an equivalent circuit of a TFT substrate provided in another example of the liquid crystal display device according to the embodiment of the invention.
Figure 14:
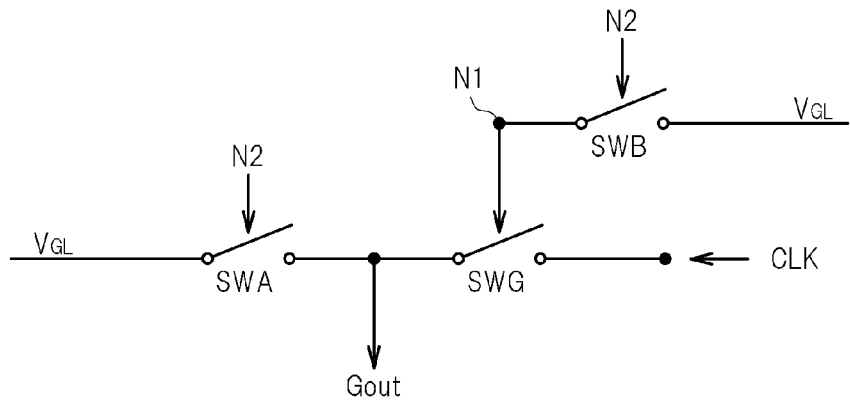
FIG. 14 is a schematic diagram showing a configuration of a fundamental circuit of a shift register circuit according to the related art.

Although the present embodiment has been described by way of an IPS-mode liquid crystal display device, the display device according to the invention may be a liquid crystal display device of the other driving modes such as a VA (Vertically Aligned) mode or a TN (Twisted Nematic) mode and may be other display devices such as an organic EL display device. FIG. 13 is a schematic diagram of an equivalent circuit of the TFT substrate 102 provided in a VA or TN-mode liquid crystal display device. In the case of the VA or TN mode liquid crystal display device, the common electrodes 111 are provided on a side of the filter substrate 101 facing the TFT substrate 102.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A gate signal line driving circuit which applies a high voltage to gate signal lines in a signal high period and applies a low voltage to the gate signal lines in a signal low period different from the signal high period, comprising:
   a high voltage application switching element which is put into an ON state in response to the signal high period to apply the high voltage to the gate signal lines and which is put into an OFF state in response to the signal low period;
   first and second low voltage application switching elements which are connected in parallel to the gate signal lines and which apply the low voltage to the gate signal lines when the first and second low voltage application switching elements are in the ON state;
   a control voltage output circuit which includes a holding capacitor that supplies an ON signal toward at least one of the switch inputs of the first and second low voltage application switching elements in the signal low period;
   a first control switching element which is put into an ON state in a first period including the high and low periods and which puts the first low voltage application switching element into an OFF state;
   a second control switching element which is put into an ON state in a second period that is different from the first period and includes the high and low periods and which transmits the ON signal to the first low voltage application switching element;
   a third control switching element which is put into an ON state in the second period and which puts the second low voltage application switching element into an OFF state;
   a fourth control switching element which is put into an ON state in the first period and which transmits the ON signal to the second low voltage application switching element; and
   a shift register control circuit which controls ON/OFF of the first to fourth control switching elements,
   wherein the shift register control circuit puts the first to fourth control switching elements into an ON state in a startup period before the first and second periods and supplies an initial voltage that causes electric charge to be stored in the holding capacitor, the electric charge supplying the ON signal to the holding capacitor through the first and third control switching elements, and
   wherein the shift register control circuit puts the first and fourth control switching elements into an ON state and the second and third control switching elements into an OFF state in the first period and puts the second and third control switching elements into an ON state and the first and fourth control switching elements into an OFF state in the second period.

2. The gate signal line driving circuit according to claim 1, wherein the shift register control circuit includes:
   a first conversion switch one end of which is connected to the switch inputs of the first and fourth control switching elements and which supplies a control switch-on signal to the switch inputs in the startup period and the first period, and
   a second conversion switch one end of which is connected to the switch inputs of the second and third control switching elements and which supplies a control switch-on signal to the switch inputs in the startup period and the second period.

3. The gate signal line driving circuit according to claim 2, wherein one end of the holding capacitor is connected to one end of the second control switching element and one end of the fourth control switching element,
   wherein the first control switching element is provided between the other end of the second control switching element and the second conversion switch included in the shift register control circuit,
   wherein the third control switching element is provided between the other end of the fourth control switching element and the first conversion switch included in the shift register control circuit,
   wherein the first conversion switch included in the shift register control circuit supplies a high voltage towards the third control switching element in the startup period and the first period and supplies a low voltage towards the third control switching element in the second period, and
   wherein the second conversion switch included in the shift register control circuit supplies a high voltage towards the first control switching element in the startup period and the second period and supplies a low voltage towards the first control switching element in the first period.

4. The gate signal line driving circuit according to claim 2, wherein the shift register control circuit further includes a low voltage conversion switch which supplies a low voltage to the control voltage output circuit in the startup period and the first and second periods, and
   wherein the first and second conversion switches and the low voltage conversion switch included in the shift register control circuit supply a high voltage when a power supply voltage decreases.

5. The gate signal line driving circuit according to claim 1, further comprising:
   first and second switching signal supply switching elements which are connected in parallel to the switch input of the high voltage application switching element and which apply a low voltage to the switch input of the high voltage application switching element when the first and second switching signal supply switching elements are in the ON state, wherein the holding capacitor supplies an ON signal towards at least one of the switch inputs of the first and second low voltage application switching elements and at least one of the switch inputs of the first and second switching signal supply switching elements in the signal low period, wherein the second control switching element is put into an ON state in the first period to supply the ON signal to the first low voltage application switching element and the first switching signal supply switching element, and wherein the fourth control switching element is put into an ON state in the second period to supply the ON signal to the second low voltage application switching element and the second switching signal supply switching element.

6. The gate signal line driving circuit according to claim 5, wherein the shift register control circuit supplies a low voltage to the gate signal lines through the first and second low voltage application switching elements in the startup period and supplies a low voltage to the high voltage application switching element through the first and second switching signal supply switching elements.

7. The gate signal line driving circuit according to claim 1, wherein the shift register control circuit supplies a low voltage to the gate signal lines through the first and second low voltage application switching elements in the startup period.

8. The gate signal line driving circuit according to claim 1, wherein the control voltage output circuit further includes a charge supply switching element one end of which is connected to one end of the holding capacitor and which periodically supplies a voltage that causes electric charge to be stored in the holding capacitor in the first and second periods, the electric charge supplying an ON signal to the holding capacitor, and wherein the charge supply switching element is put into an OFF state in the startup period and the other end of which is supplied with a high voltage.

9. A display device comprising the gate signal line driving circuit according to claim 1.

10. A display device comprising:
a display panel; and
a gate signal line driving circuit which is formed in a display panel so as to output a scanning signal to the display panel, the gate signal line driving circuit including a plurality of stages of fundamental circuits, each of the fundamental circuits including,
an ON-voltage output element,
a first node connected to a control terminal of the ON-voltage output element,
a first switching element which supplies a high voltage to the first node in accordance with an output signal from a fundamental circuit at a previous stage;
a second switching element which supplies a low voltage to the first node in accordance with an output signal from a fundamental circuit at a next stage,
first and second OFF-voltage output elements,
a second node electrically connected to the control terminals of the first and second OFF-voltage output elements,
a third switching element the control terminal of which is connected to a clock signal and which supplies a high voltage to the second node,
a fourth switching element the control terminal of which is connected to the first node and which supplies a low voltage to the second node,
fifth and sixth switching elements the control terminals of which are electrically connected to the second node and which supply a low voltage to the first node when the fifth and sixth switching elements are in the ON state,
a first control switching element which electrically disconnects the control terminal of the first OFF-voltage output element and the second node in the first period and which electrically connects the control terminal of the first OFF-voltage output element and the second node in the second period,
a second control switching element which supplies a low voltage to the control terminal of the first OFF-voltage output element in the first period,
a third control switching element which electrically disconnects the control terminal of the second OFF-voltage output element and the second node in the first period and which electrically connects the control terminal of the second OFF-voltage output element and the second node in the second period, and
a fourth control switching element which supplies a low voltage to the control terminal of the second OFF-voltage output element in the second period,
wherein the first node is changed so as to have a high voltage by the first switching element, the ON-voltage output element outputs an ON voltage, and the fourth switching element changes the second node so as to have a low voltage,
wherein the first and second OFF-voltage output elements are put into the OFF state by the second node being at a low voltage,
wherein the first node is changed so as to have a low voltage by the second switching element, the ON-voltage output element is put into the OFF state, and the fourth switching element is put into the OFF state, whereby the second node is charged to a high voltage by the third switching element,
wherein the second node is changed so as to have a high voltage, whereby the first and second OFF-voltage output elements are put into the ON state to output an OFF voltage, and the fifth and sixth switching elements supply a low voltage to the first node, and
wherein the first to fourth control switching elements are put into the ON state in a third period to supply a high voltage to the second node.

11. The display device according to claim 10, further comprising:
a first control signal line connected to the control terminal of the first control switching element, the input terminal of the second control switching element, and the control terminal of the fourth control switching element, and
a second control signal line connected to the control terminal of the third control switching element, the input terminal of the fourth control switching element, and the control terminal of the second control switching element,
wherein in the third period, the first and second control signal lines being at a high voltage put the first to fourth control switching elements into the ON state and supply a high voltage to the second node.

12. The display device according to claim 10, further comprising:
a first control signal line connected to the control terminal of the first control switching element, the input terminal of the second control switching element, and the control terminal of the fourth control switching element, and a second control signal line connected to the control terminal of the third control switching element, the input terminal of the fourth control switching element, and the control terminal of the second control switching element, wherein in the first period, the first control signal line is at a low voltage, and the second control signal line is at a high voltage, wherein in the second period, the first control signal line is at a high voltage, and the second control signal line is at a low voltage, and wherein in the third period, the first and second control signal lines are at a high voltage, the first to fourth control switching elements are put into the ON state, and a high voltage is supplied to the second node.

13. The display device according to claim 10, wherein the second control switching element supplies a low voltage to the control terminal of the fifth switching element in the first period, and wherein the fourth control switching element supplies a low voltage to the control terminal of the sixth switching element in the second period.

\* \* \* \* \*